(12) United States Patent
Park et al.

(10) Patent No.: US 10,673,005 B2
(45) Date of Patent: Jun. 2, 2020

(54) ORGANIC LIGHT-EMITTING DEVICE AND ORGANIC LIGHT-EMITTING DISPLAY DEVICE USING THE SAME

(71) Applicant: LG Display Co., Ltd., Seoul (KR)

(72) Inventors: Eun-Jung Park, Goyang-si (KR); Sang-Kyoung Moon, Ulsan (KR); Seok-Hyun Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/198,293

(22) Filed: Nov. 21, 2018

(65) Prior Publication Data

US 2019/0198788 A1    Jun. 27, 2019

(30) Foreign Application Priority Data

Nov. 30, 2017 (KR) ........................ 10-2017-0163768

(51) Int. Cl.
*H01L 27/32* (2006.01)
*H01L 51/50* (2006.01)
*H01L 51/52* (2006.01)

(52) U.S. Cl.
CPC ........ *H01L 51/504* (2013.01); *H01L 27/3244* (2013.01); *H01L 51/5278* (2013.01); *H01L 27/3211* (2013.01); *H01L 51/5056* (2013.01); *H01L 51/5072* (2013.01); *H01L 51/5088* (2013.01); *H01L 51/5092* (2013.01); *H01L 2251/5376* (2013.01)

(58) Field of Classification Search
CPC ............. H01L 27/3211; H01L 27/3244; H01L 51/504; H01L 51/5056; H01L 51/5072; H01L 51/5088; H01L 51/5092; H01L 51/5265; H01L 51/5278
See application file for complete search history.

(56) References Cited

U.S. PATENT DOCUMENTS

| | | | |
|---|---|---|---|
| 2015/0155519 A1* | 6/2015 | Lee ...................... | H01L 51/5234 257/40 |
| 2015/0188067 A1* | 7/2015 | Lee ...................... | H01L 51/5234 257/40 |
| 2015/0188087 A1* | 7/2015 | Lee ...................... | H01L 51/5265 257/40 |
| 2015/0194471 A1* | 7/2015 | Lee ...................... | H01L 51/5218 257/40 |
| 2016/0268513 A1* | 9/2016 | Ishisone .............. | H01L 51/0051 |
| 2016/0293862 A1* | 10/2016 | Metz ..................... | H01L 51/504 |

* cited by examiner

*Primary Examiner* — Joseph M Galvin, III
(74) *Attorney, Agent, or Firm* — Fenwick & West LLP

(57) ABSTRACT

An organic light-emitting device is disclosed. The organic light-emitting device includes light-emitting layers that emit light of the same color in a stack structure. The phosphorescence and fluorescence characteristics at the exit side and the inside of the organic light-emitting device are adjusted to improve a viewing angle, lifetime, and efficiency.

19 Claims, 15 Drawing Sheets

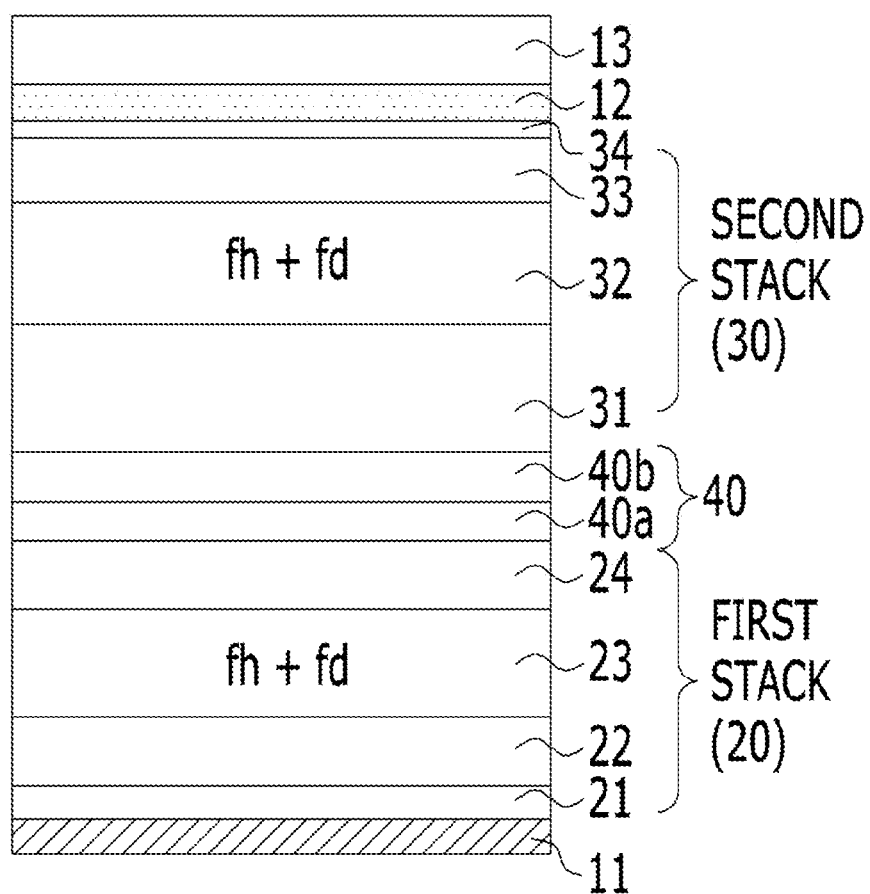

ORGANIC LIGHT-EMITTING DEVICE AND ORGANIC LIGHT-EMITTING DISPLAY DEVICE USING THE SAME

This application claims priority to Republic of Korean Patent Application No. 10-2017-0163768, filed on Nov. 30, 2017, which is hereby incorporated by reference as if fully set forth herein.

BACKGROUND

Field of the Technology

The present disclosure relates to an organic light-emitting device, and more particularly, to an organic light-emitting device configured such that light-emitting layers that emit light of the same color are applied to different stacks, whereby the efficiency and lifetime of the organic light-emitting device are improved, and an organic light-emitting display device using the same.

Discussion of the Related Art

Recently, with the advent of the information age, the field of displays that visually display electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, the organic light-emitting display device is considered a competitive application because it does not require a separate light source and enables the realization of a compact device design and vivid color display.

Meanwhile, the organic light-emitting display device includes a plurality of organic light-emitting devices for emitting light, which are provided on a substrate having a plurality of subpixels. Each of the organic light-emitting devices includes a positive electrode and a negative electrode, as well as a hole transport layer, a light-emitting layer, and an electron transport layer sequentially disposed between the positive electrode and the negative electrode.

An organic light-emitting device is a device that emits light when an electric field is applied across the positive electrode and the negative electrode. The organic light-emitting device is characterized in that the organic light-emitting device can be driven at low voltage, the power consumption of the organic light-emitting device is relatively low, and the organic light-emitting device can be manufactured even on a lightweight and flexible substrate.

The organic light-emitting display device includes an organic light-emitting device provided at each subpixel for emitting light. In a light-emitting layer of each organic light-emitting device, holes and electrons are combined with each other to produce excitons. When the excitons fall to the ground state, light is generated from the organic light-emitting device. Light emission efficiency is set depending on the efficiency of combination of holes and electrons in the light-emitting layer.

Meanwhile, the organic light-emitting device provided at each of the subpixels may be configured to have a single-stack structure, in which a single light-emitting layer that emits light of a different color is provided for each subpixel such that the light-emitting layer is provided in a single stack, or a tandem structure, in which a plurality of stacks having light-emitting layers that emit light of different colors is overlapped in order to commonly emit white light from all of the subpixels and a color filter layer for selectively transmitting light of another color is provided on the organic light-emitting device.

In the case in which the organic light-emitting device is used in a display device, the organic light-emitting device is connected to a thin film transistor so as to be driven by current supplied from the thin film transistor. For high resolution display, the area of the thin film transistor occupying each subpixel, the subpixels having a reduced size, is reduced, whereby the efficiency of supply of current from the thin film transistor is decreased for structural reasons. For this reason, research has been conducted with the goal of improving the current efficiency of the organic light-emitting device. However, the efficiency of the organic light-emitting device is related to the structure and material thereof. Since the lifetime may be greatly changed in the case in which the structure and material are changed, it is difficult to realize an organic light-emitting device that is suitable for high resolution and is reliable in terms of lifetime and efficiency.

SUMMARY

Accordingly, the present disclosure is directed to an organic light-emitting device and an organic light-emitting display device using the same that substantially obviate one or more problems due to limitations and disadvantages of the related art.

An object of the present disclosure is to provide an organic light-emitting device configured such that light-emitting layers that emit light of the same color are applied to different stacks, whereby the efficiency, lifetime, and reliability of the organic light-emitting device are improved, and an organic light-emitting display device using the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

An organic light-emitting device according to the present disclosure is configured such that light-emitting layers that emit light of the same color are provided in a plurality of stacks, whereby the light emission efficiency, lifetime, and viewing angle characteristics of the organic light-emitting device are improved.

To achieve these objects and other advantages and in accordance with the purpose of the disclosure, as embodied and broadly described herein, an organic light-emitting device includes a first electrode, a second electrode opposite the first electrode, the second electrode being used as an exit side, first to n-th (n being a natural number equal to or greater than 2) stacks disposed between the first and second electrodes, the first to n-th stacks having light-emitting layers that emit light of the same color, and (n-1) charge generation layers disposed between neighboring ones of the first to n-th stacks, each of the (n-1) charge generation layers including an n-type charge generation layer and a p-type charge generation layer, wherein the light-emitting layer of the n-th stack is a phosphorescent light-emitting layer, the light-emitting layer of at least one of the first to (n-1)-th stacks is a fluorescent light-emitting layer, and distances from the interface between the n-type and p-type charge generation layers of each of the charge generation layers to the light-emitting layers of stacks adjacent thereto are the same, or a distance from the interface between the n-type and p-type charge generation layer to the light-emitting layer of a stack close to the second electrode is greater than the distance from the interface between the distance from the interface between the n-type charge generation layer and the p-type charge generation layer to the light-emitting layer of the stack close to the first electrode.

Among distances from an interface between the n-type and p-type charge generation layers of each of the charge generation layers to the light-emitting layers of stacks adjacent thereto, the distance from the interface between the n-type and p-type charge generation layers of each of the charge generation layers to the light-emitting layer of the stack close to the second electrode may be 2.2 or less times the distance from the interface between the n-type and p-type charge generation layers of each of the charge generation layers to the light-emitting layer of a stack close to the first electrode.

The phosphorescent light-emitting layer of the n-th stack may be thicker than the fluorescent light-emitting layer of the at least one of the first to (n-1)-th stacks.

The phosphorescent light-emitting layer may include at least one phosphorescent host and a phosphorescent dopant that emits light including a first wavelength, the fluorescent light-emitting layer may include at least one fluorescent host and a fluorescent dopant that emits light including the first wavelength, and the phosphorescent dopant may have a peak light emission at a lower wavelength than the fluorescent dopant.

The full width at half maximum of an emission spectrum of the phosphorescent light-emitting layer may include the full width at half maximum of an emission spectrum of the fluorescent light-emitting layer.

In neighboring ones of the first to n-th stacks, the distance between the light-emitting layers may range from 800 Å to 1200 Å.

In neighboring ones of the first to n-th stacks, one of which includes a fluorescent light-emitting layer and the other of which includes a phosphorescent light-emitting layer, a distance from the interface between n-type charge generation layer and p-type charge generation layer to the fluorescent light-emitting layer may be 200 Å or more.

In another aspect of the present disclosure, an organic light-emitting display device includes a substrate having regularly arranged first to third subpixels, a thin film transistor provided at each of the first to third subpixels, and first to third organic light-emitting devices, each of which is electrically connected to the thin film transistor at a corresponding one of the first to third subpixels, each of the first to third organic light-emitting devices including a first electrode, a second electrode opposite the first electrode, the second electrode being used as an exit side, first to n-th (n being a natural number equal to or greater than 2) stacks disposed between the first and second electrodes, the first to n-th stacks having light-emitting layers that emit light of the same color, and (n-1) charge generation layers disposed between neighboring ones of the first to n-th stacks, each of the (n-1) charge generation layers including an n-type charge generation layer and a p-type charge generation layer. The light-emitting layers in the first to n-th stacks of each of the first to third subpixels may emit light of the same color, and in at least one of the first to third subpixels, the light-emitting layer of the n-th stack may be a phosphorescent light-emitting layer, the light-emitting layer of at least one of the first to (n-1)-th stacks may be a fluorescent light-emitting layer, and the distances from the interface between the n-type and p-type charge generation layers of each of the charge generation layers to the light-emitting layers of stacks adjacent thereto may be the same, or the distance from the interface between the n-type charge generation layer and the p-type charge generation layer to the light-emitting layer of a stack close to the second electrode may be greater than the distance from the interface between the n-type charge generation layer and the p-type charge generation layer to the light-emitting layer of the stack close to the first electrode.

The first to third subpixels may have first to third light-emitting layers that emit light of different colors for corresponding ones of the first to n-th stacks, and the first to third light-emitting layers may have different thicknesses.

The first to n-th stacks may have a common layer that is commonly provided for the first to third subpixels, excluding the light-emitting layers.

The charge generation layers may be commonly provided for the first to third subpixels without disconnection.

An embodiment of the present disclosure relates to an organic light-emitting device. The organic light-emitting device includes a substrate, a first electrode on the substrate, a second electrode on the first electrode, and a plurality of stacks disposed between the first electrode and the second electrode. Each stack of the plurality of stacks includes a light-emitting layer. The plurality of stacks includes a first stack and a second stack. The first stack includes a first light-emitting layer that is a fluorescent light-emitting layer and is configured to emit light of a first color. The second stack includes a second light-emitting layer that is a phosphorescent light-emitting layer and is configured to emit light of the first color. The second stack is a top-most stack in the plurality of stacks in a direction along the first electrode to the second electrode.

An embodiment of the present disclosure relates to an organic light-emitting display device that includes a substrate, a first subpixel on the substrate for emitting light of a first color, a second subpixel on the substrate for emitting light of a second color, and a third subpixel on the substrate for emitting light of a third color. Each subpixel includes a first electrode on the substrate, a second electrode on the first electrode, and a plurality of stacks disposed between the first electrode and the second electrode. Each stack includes a light-emitting layer. Each stack of the plurality of stacks includes a first stack and a second stack on the first stack. The first stack includes a first light-emitting layer that is a fluorescent light-emitting layer and is configured to emit light of a respective color of the subpixel. The second stack includes a second light-emitting layer that is a phosphorescent light-emitting layer and is configured to emit light of the respective color of the subpixel. The second stack is a top-most stack in the plurality of stacks in a direction along the first electrode to the second electrode.

An embodiment of the present disclosure relates to an organic light-emitting display device including a substrate, a first electrode of a first subpixel and a first electrode of a second subpixel on the substrate, a first light-emitting layer on the first electrode of the first subpixel, a second light-emitting layer on the first electrode of the second subpixel disposed adjacent to the first light-emitting layer, a charge generation layer on the first light-emitting layer and the second light-emitting layer, a third light-emitting layer on the charge generation layer overlapping the first light-emitting layer, a fourth light-emitting layer on the charge generation layer disposed adjacent to the third light-emitting layer and overlapping the second light-emitting layer, and a second electrode on the third light-emitting layer and the fourth light-emitting layer. The first light-emitting layer is a fluorescent light-emitting layer and is configured to emit light of a first color. The second light-emitting layer is a fluorescent light-emitting layer and is configured to emit light of a second color. The third light-emitting layer is a phosphorescent light-emitting layer and is configured to emit light of the first color. The fourth light-emitting layer is a phosphorescent light-emitting layer and is configured to emit light of the second color.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 2A to 2C are sectional views showing organic light-emitting devices according to first to third comparative examples, respectively;

DETAILED DESCRIPTION OF THE DISCLOSURE

Figure 1:
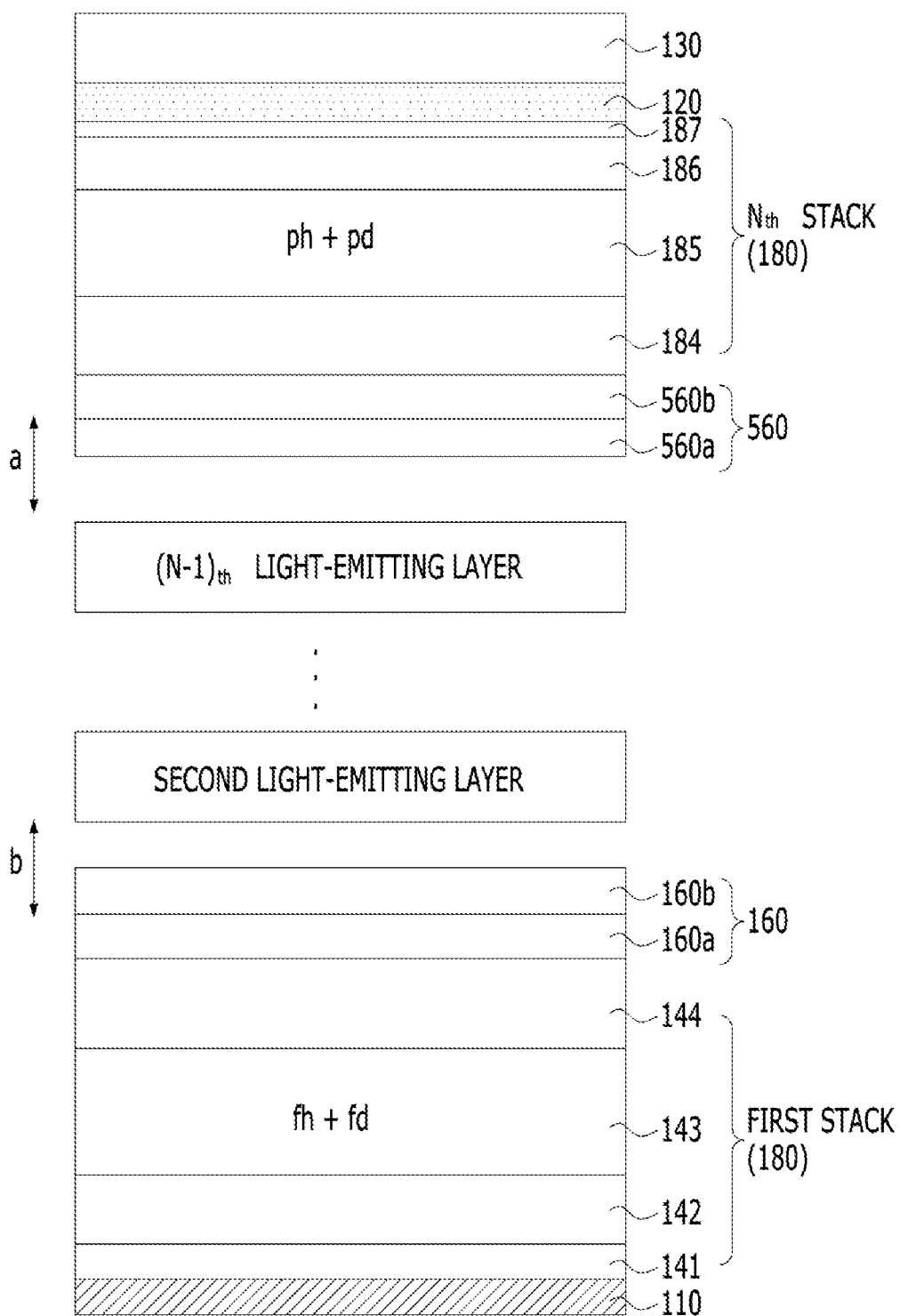
FIG. 1 is a sectional view showing an organic light-emitting device according to the present disclosure.

The advantages and features of the present disclosure and the way of attaining them will become apparent with reference to embodiments described below in detail in conjunction with the accompanying drawings. The present disclosure, however, is not limited to the embodiments disclosed hereinafter, and may be embodied in many different forms. Rather, these exemplary embodiments are provided so that this disclosure will be thorough and complete and will fully convey the scope to those with normal skill in the art. The scope of the present disclosure should be defined by the claims.

In the drawings for explaining the exemplary embodiments of the present disclosure, for example, the illustrated shape, size, ratio, angle, and number are given by way of example, and thus, are not limitative of the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises", "includes", and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on", "above", "below", "aside", or the like, one or more other parts may be located between the two parts unless the term "directly" or "closely" is used therewith.

In the description of the various embodiments of the present disclosure, when describing temporal relationships, for example, when the temporal relationship between two actions is described using "after", "subsequently", "next", "before", or the like, the actions may not occur in succession unless the term "immediately" or "directly" is used therewith.

In the description of the various embodiments of the present disclosure, although terms such as, for example, "first" and "second" may be used to describe various elements, these terms are merely used to distinguish the same or similar elements from each other. Therefore, in the present specification, an element indicated by "first" may be the same as an element indicated by "second" within the technical scope of the present disclosure unless otherwise mentioned.

The respective features of the various embodiments of the present disclosure may be partially or wholly coupled to and combined with each other, and various technical linkages there between and operation methods thereof are possible. These various embodiments may be performed independently of each other, or may be performed in association with each other.

In this specification, the term "doped" means that a material of any layer, which has physical properties (e.g., N-type and P-type material, or an organic material and an inorganic material) different from the material that occupies the greatest weight percentage of the corresponding layer, is added to the material accounting for the greatest weight percentage in an amount corresponding to a weight percentage of less than 10%. In other words, a "doped" layer means a layer in which a host material and a dopant material of any layer are distinguishable from each other in consideration of the weight percentages thereof. In addition, the term "undoped" refers to all cases excluding the case that corresponds to the term "doped". For example, when any layer is formed of a single material or is formed of a mixture of materials having the same or similar properties, the layer considered an "undoped" layer. For example, when at least one of constituent materials of any layer is of a P-type and none of the other constituent materials of the layer are of an N-type, the layer is considered an "undoped" layer. For example, when at least one of the constituent materials of any layer is an organic material and none other constituent materials of the layer are inorganic materials, the layer is considered an "undoped" layer. For example, when all constituent materials of any layer are organic materials, at least one of the constituent materials is of an N-type, at least another constituent material is of a P-type, and the weight percent of the N-type material is less than 15% or the weight percent of the P-type material is less than 15%, the layer is considered a "doped" layer.

In this specification, "stack" means a unit structure that includes organic layers such as a hole transport layer and an electron transport layer, with an organic emission layer interposed between the hole transport layer and the electron transport layer. The organic layers may further include a hole injection layer, an electron blocking layer, a hole-blocking layer, and an electron injection layer, and may further include other organic layers according to the structure or design of an organic light-emitting device.

FIG. 1 is a sectional view showing an organic light-emitting device according to the present disclosure.

As shown in FIG. 1, the organic light-emitting device according to the present disclosure includes a first electrode 110, a second electrode 120 opposite the first electrode 110, the second electrode 120 being used as an exit side, first to n-th (n being a natural number equal to or greater than 2) stacks 180 disposed between the first and second electrodes 110 and 120, the first to n-th stacks having light-emitting layers 143, . . . , and 185 that emit light of the same color, and (n-1) charge generation layers 160, . . . , and 560 disposed between neighboring ones of the first to n-th stacks, the (n-1) charge generation layers 160, . . . , and 560 respectively including n-type charge generation layers 160a and 560a and p-type charge generation layers 160b and 560b.

Here, the light-emitting layer 185 of the n-th stack 180 is a phosphorescent light-emitting layer ph+pd, and the light-emitting layer of at least one of the first to (n-1)-th stacks is a fluorescent light-emitting layer fh+fd. FIG. 1 shows an example in which a fluorescent light-emitting layer is applied to the first stack. Among the first to (n-1)-th stacks, each of the stacks having no fluorescent light-emitting layer has a phosphorescent light-emitting layer.

In this case, the minimum number of stacks of the organic light-emitting device according to the present disclosure is two. For example, in the case in which two stacks are provided between the first and second electrodes 110 and 120, the first stack has a first light-emitting layer that is a fluorescent light-emitting layer and the second stack has a second light-emitting layer that is a phosphorescent light-emitting layer.

Thus, a charge generation layer from 160, . . . , 560 may be disposed between an adjacent pair of stacks, and the charge generation layer may include an n-type charge generation layer 160a, 560a and a p-type charge generation layer 160b, 560b. A first distance is measured from an interface between the n-type charge generation layer 160a, 560a and the p-type charge generation layer 160b, 560b to the light-emitting layer of an adjacent stack closer to the first electrode 110. A second distance is measured from the interface to the light-emitting layer of an adjacent stack 180 closer to the second electrode 120. The first distance is less than or equal to the second distance.

In addition, the distances a and b from the interfaces between the n-type charge generation layers 160a and 560a and the p-type charge generation layers 160b and 560b of the charge generation layers 160, . . . , and 560 to the light-emitting layers of the stacks adjacent thereto may be the same, or the distance a from the interface between the n-type charge generation layer 160a, 560a and the p-type charge generation layer 160b, 560b to the light-emitting layer of the stack close to the second electrode 120 may be greater than the distance b from the interface between the n-type charge generation layer 160a, 560a and the p-type charge generation layer 160b, 560b to the light-emitting layer of the stack 180 close to the first electrode 110. The reason for this is that, in a structure in which a plurality of stacks are divided from each other by charge generation layers, the mobility of holes transmitted from the p-type charge generation layers 160b and 560b to a hole transport layer of the next stack is higher than the mobility of electrons transmitted from the n-type charge generation layers to an electron transport layer of the previous stack in terms of transportability of carriers transmitted to adjacent stacks through the charge generation layers 160 and 560. Consequently, the thickness of a hole transport layer 184 of the upper stack adjacent to the charge generation layers is set to be greater than the thickness of an electron transport layer 144 of the lower stack adjacent to the charge generation layers such that the transport length of the holes is greater than the transport length of the electrons. As a result, the holes and the electrons are supplied into the light-emitting layers 185 and 143 of the stacks at similar speeds such that the holes and the electrons are combined with each other only in the light-emitting layers 185 and 143. Consequently, uncombined electrons are prevented from accumulating at the interface between the hole transport layer and the light-emitting layer, or uncombined holes are prevented from being accumulated on the interface between the electron transport layer and the light-emitting layer, whereby it is possible to prevent a reduction in the lifetime of the organic light-emitting device due to accumulation of carriers on the interface.

In addition, the distance a from the interface between the n-type and p-type charge generation layers 160a and 160b and 560a and 560b of the charge generation layers 160, . . . , and 560 to the light-emitting layer of the stack close to the second electrode 120 may be 2.2 or less times the distance b from the interface between the n-type and p-type charge generation layers of the charge generation layers to the light-emitting layer of the stack close to the first electrode 110. That is, the second distance is also less than or equal to 2.2 times the first distance, in addition to being greater than or equal to the first distance. The numerical meaning of a:b will be further described in the following experimental example.

Meanwhile, the stacks of the organic light-emitting device according to the present disclosure include hole transport layers 142 and 184 and electrode transport layers 144 and 186 abutting on the upper and lower parts of the light-emitting layers, in addition to the light-emitting layers. The stack close to the first electrode 110 further includes a hole injection layer 141 having a p-type dopant in order to inject holes, and the stack close to the second electrode 120 further includes an electron injection layer 187 that lowers a barrier to the injection of electrons. Since the electron injection layer 187 is mainly made of an inorganic material, the electron injection layer 187 may be considered as a portion of the second electrode 120, by which the electron injection layer 187 is distinguished from organic layers between the first and second electrodes 110 and 120.

The organic light-emitting device according to the present disclosure is configured to have a top emission type structure, in which the second electrode 120 serves as an exit side. Consequently, the second electrode 120 is made of a transparent material, such as ITO, IZO, ITZO, or IGZO, or is made of a semitransparent material, such as AgMg. In the case in which the second electrode 120 is made of a semitransparent material, the thickness of the second electrode 120 may be at least 1/10 of the thickness of a second electrode 120 that is made of a transparent material. The first electrode 110 is configured to have a structure in which a transparent electrode that exhibits high interfacial adhesion to an organic material, such as an electrode made of ITO, and a reflective electrode that exhibits high reflectance so as to enable light, emitted from the light-emitting layer of each stack and transmitted downwards, to be transmitted upwards again are stacked.

Meanwhile, a capping layer 130 for protecting the organic light-emitting device and improving the optical efficiency of the organic light-emitting device may be further provided on the second electrode 120. Although not shown, when the organic light-emitting device is applied to a device, a barrier stack, in which inorganic films and organic films are alternately stacked to encapsulate the organic light-emitting device, may be further provided on the capping layer 130.

The phosphorescent light-emitting layer 185, as the n-th light-emitting layer provided in the n-th stack, which is close to the exit side, may have a larger thickness than the fluorescent light-emitting layer 143 of any one of the other stacks. The reason for this is that, in the case in which the thickness of the phosphorescent light-emitting layer is increased to a predetermined level, it is possible to reduce the driving voltage of the organic light-emitting device and to improve the efficiency of the organic light-emitting device.

In addition, the phosphorescent light-emitting layer 185 includes at least one phosphorescent host ph and a phosphorescent dopant pd that emits light including a first wavelength. The fluorescent light-emitting layer 143 of any one of the other stacks includes at least one fluorescent host fh and a fluorescent dopant fd that emits light including the first wavelength. One to four hosts ph and fh may be included in the light-emitting layers 185 and 143. Each of the phosphorescent dopant pd and the fluorescent dopant fd is included so as to have 15 wt % or less the total mass of the hosts of a corresponding one of the light-emitting layers. In the case in which a plurality of hosts is provided in each light-emitting layer, the hosts may have hole mobilities and electron mobilities that are different from each other. It is possible to adjust the coupling area of holes and electrons in each light-emitting layer in consideration of the mobility and mass ratio of the hosts.

Meanwhile, the phosphorescent dopant pd has a peak light emission wavelength at a lower wavelength than the fluorescent dopant fd peak light emission wavelength. In addition, the full width at half maximum of an emission spectrum of the phosphorescent light-emitting layer 185 includes the full width at half maximum of an emission spectrum of the fluorescent light-emitting layer 143. The phosphorescent light-emitting layer 185 emits light of the same color as the fluorescent light-emitting layer 143, but may emit light having higher intensity than the fluorescent light-emitting layer 143. This means that, even in the case in which the phosphorescent light-emitting layer 185 and the fluorescent light-emitting layer 143 have the same thickness, the light emission efficiency of the phosphorescent light-emitting layer 185 is higher than the light emission efficiency of the fluorescent light-emitting layer 143. In particular, the organic light-emitting device according to the present disclosure is configured such that the phosphorescent light-emitting layer 185 is provided in the stack abutting on the second electrode 120, which serves as the exit side, in order to improve the exit efficiency of light at the exit side.

Figure 3A:
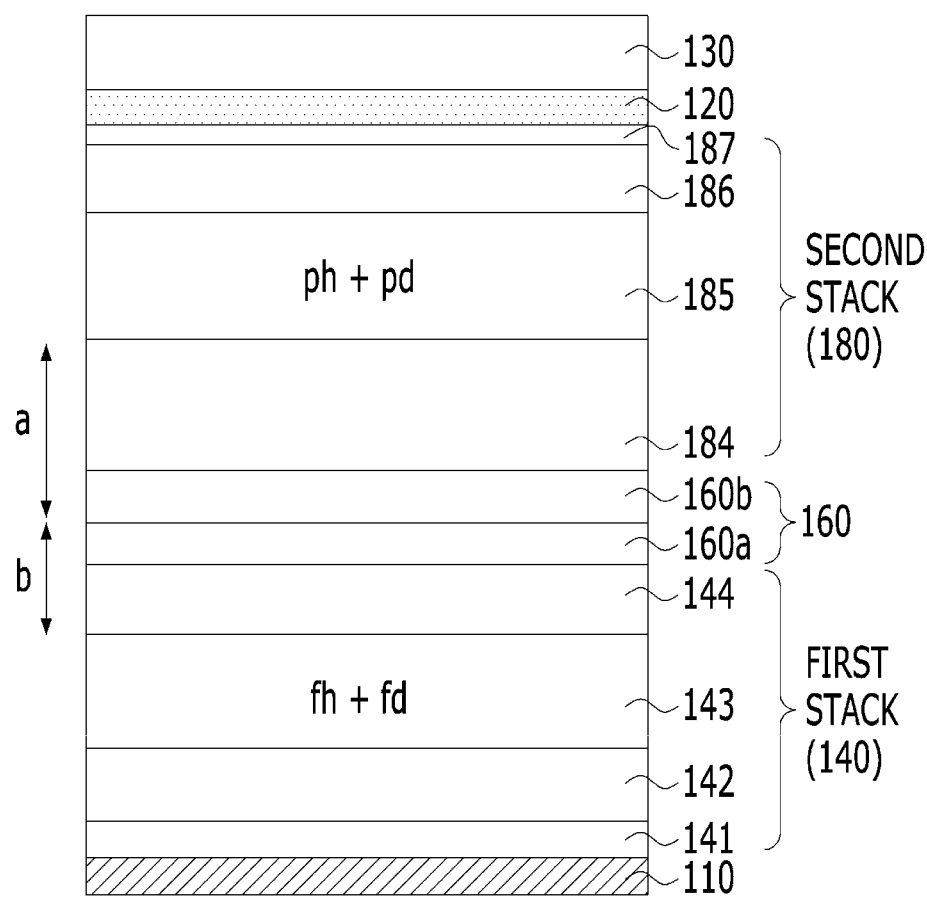
FIGS. 3A and 3B are sectional views showing organic light-emitting devices according to first and second embodiments, respectively, of the present disclosure.

In FIG. 3A, the first light-emitting layer 143 includes at least one fluorescent host and a fluorescent dopant that emits light of a first color. The second light-emitting layer 185 includes at least one phosphorescent host and a phosphorescent dopant that emits light of the first color. The phosphorescent dopant has a peak light emission at a lower wavelength than the peak light emission of the fluorescent dopant. Additionally, a full width at half maximum of an emission spectrum of the second light-emitting layer 185 is wider than a full width at half maximum of an emission spectrum of the first light-emitting layer 143.

In the structure in which light-emitting layers that emit light of the same color are applied to a plurality of stacks, a phosphorescent light-emitting layer may be provided in the stack close to the exit side, and at least one fluorescent light-emitting layer may be provided in the other stacks, which may be applied to subpixels that emit light of various colors. That is, red light-emitting layers may be provided in a plurality of stacks for a red subpixel, green light-emitting layers may be provided in a plurality of stacks for a green subpixel, and blue light-emitting layers may be provided in a plurality of stacks for a blue subpixel. Even in the case in which an organic light-emitting display device includes a subpixel having another color, such as a white subpixel or a yellow subpixel, a different kind of fluorescent light-emitting layer or phosphorescent light-emitting layer may be provided between light-emitting layers having the same color.

In the case in which a general organic light-emitting device has a tandem structure, the light-emitting layers are provided in the stacks so as to have the same properties. That is, even in the case in which a plurality of stacks is provided in a single tandem structure, the same fluorescent light-emitting layers or the same phosphorescent light-emitting layers are used as the light-emitting layers in the stacks. Particularly, in a tandem structure that emits light of the same color, the same phosphorescent light-emitting layers or the same fluorescent light-emitting layers are applied in order to reduce device or material costs.

In contrast, in the organic light-emitting device according to the present disclosure, a phosphorescent light-emitting layer is used as the light-emitting layer of the stack close to the exit side, and a fluorescent light-emitting layer is used as the light-emitting layer of at least one of the other stacks. The reason that, particularly in a structure in which phosphorescent and fluorescent light-emitting layers are combined, a phosphorescent light-emitting layer is used as the light-emitting layer of the stack close to the exit side and a fluorescent light-emitting layer is used as the light-emitting layer of at least one of the other stacks is that the inventors of the present application have found, based on experimentation, that this structure is advantageous over other combination structures in terms of efficiency, lifetime, and color deviation depending on a viewing angle.

Hereinafter, the meaning of the structure of the organic light-emitting device according to the present disclosure will be described based on comparison with comparative examples and experimentation.

In the following experiments, an example in which green light-emitting layers are applied to a plurality of stacks will be described. A stack structure including light-emitting layers having a different color also has the same or similar effects in that a phosphorescent light-emitting layer is provided in the stack closest to the exit side and a fluorescent light-emitting layer is provided in at least one of the other stacks. That is, the plurality of stacks includes at least one stack that includes a light-emitting layer configured to emit light of a second color different than a first color emitted by other stacks in the plurality of stacks.

Figure 2B:
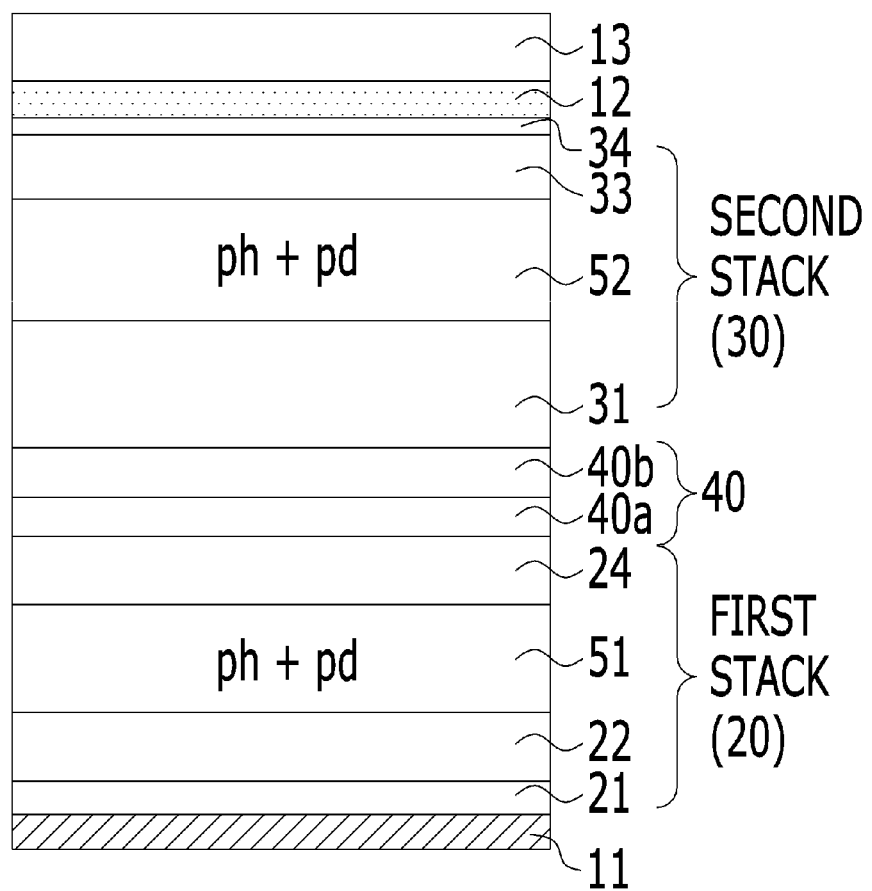
Figure 2C:
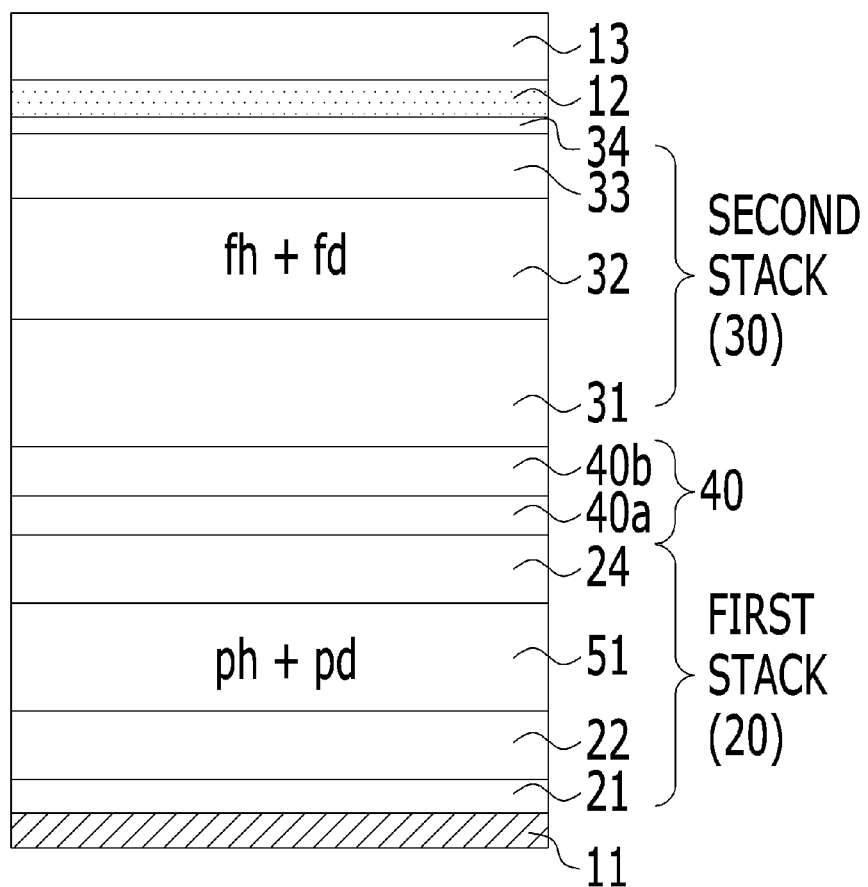
Figure 3B:
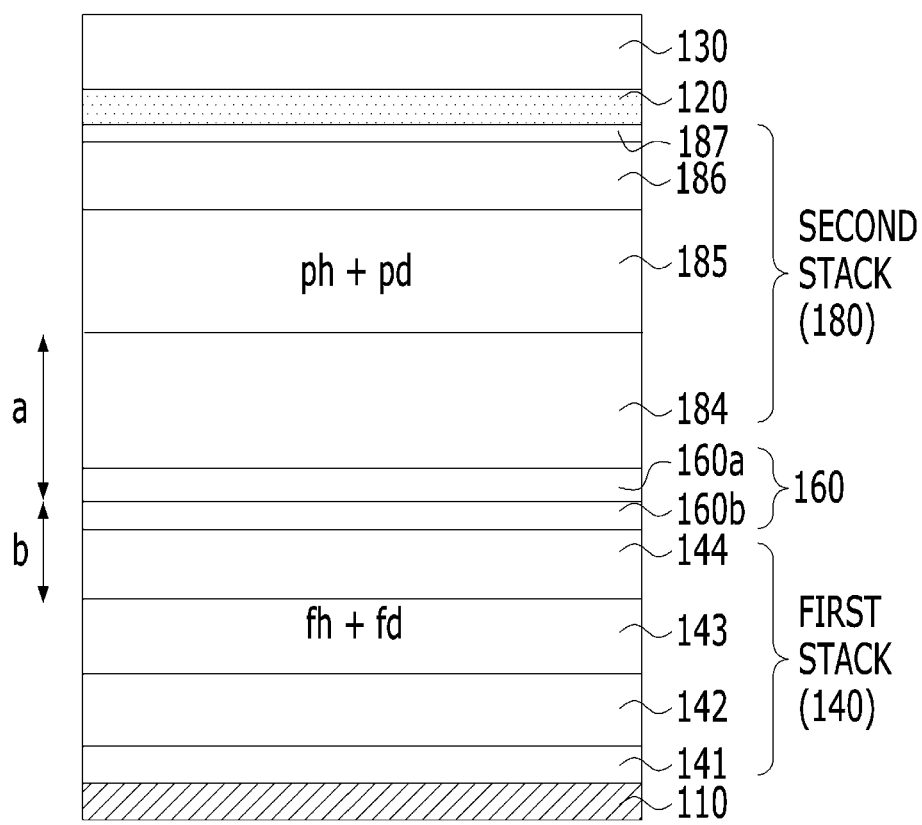
Figure 3C:
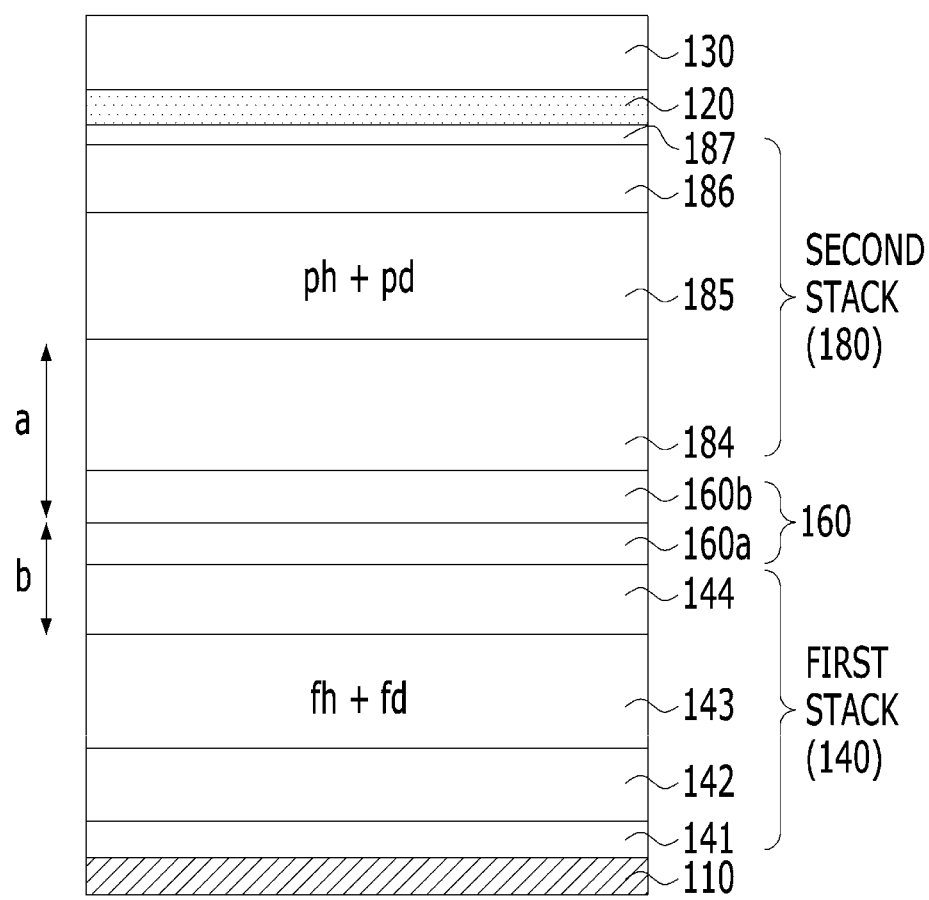

FIGS. 2A to 2C are sectional views respectively showing organic light-emitting devices according to first to third comparative examples, and FIGS. 3A and 3B are sectional views respectively showing organic light-emitting devices according to first and second embodiments of the present disclosure.

The organic light-emitting devices according to the first to third comparative examples shown in FIGS. 2A to 2C and the organic light-emitting devices according to the first and second embodiments of the present disclosure shown in FIGS. 3A and 3B are characterized in common in that two stacks are provided between first and second electrodes, which are opposite each other, and a charge generation layer is provided between the two stacks. In addition, the stacks have the same stack structure. That is, the organic light-emitting devices according to the first to third comparative examples and the first and second embodiments of the present disclosure include first stacks 20 and 140, which includes first electrodes 11 and 110, hole injection layers 21 and 141, first hole transport layers 22 and 142, first light-emitting layers 23, 541, and 143, and the first electron transport layers 24 and 144, charge generation layers 40 and 160, which include n-type charge generation layers 40a and 160a and p-type charge generation layers 40b and 160b, second stacks 30 and 180 disposed on the charge generation layers 40 and 160, the second stacks 30 and 180 including second hole transport layers 31 and 184, second light-emitting layers 32 and 185, and the second electron transport layers 33 and 186, and second electrodes 12 and 120.

The organic light-emitting devices are identical to each other in that the light-emitting layers included in the stacks emit green light, but are different from each other in that hosts and dopants are made of different materials.

That is, in the first comparative example shown in FIG. 2A, both the first light-emitting layer 23 of the first stack 20 and the second light-emitting layer 32 of the second stack 30 are fluorescent light-emitting layers. In the case in which the same fluorescent light-emitting layers are used as the first and second light-emitting layers 23 and 32, the same fluorescent hosts fh are doped with the same fluorescent dopants fd so as to have the same content. The first and second light-emitting layers 23 and 32 have the same thickness.

Specifically, a structure applied to the first comparative example based on experimentation will be described.

First, a first electrode 11 having a stack structure of ITO (70 Å)/APC (1000 Å)/ITO (70 Å) is formed on a substrate (not shown).

Subsequently, an NPD layer having a thickness of 400 Å is deposited on the first electrode 11. At the time of depositing the NPD, a portion of the NPD adjacent to the interface with the first electrode 11 having a thickness of about 50 Å is doped with 3% of a p-type dopant material TCNQF4 so in order to form a hole injection layer 21, and the remaining thickness of the NPD becomes a first hole transport layer 22.

Subsequently, an anthracene derivative having a thickness of 400 Å, as a host, is doped with about 5 wt % of an anthracene dopant, as a green fluorescent dopant, in order to form a first light-emitting layer 23 on the first hole transport layer 22.

Subsequently, tris(8-hydroxyquinoline)aluminum (Alq3) having a thickness of 150 Å is deposited on the first light-emitting layer 23 in order to form a first electron transport layer 24. In this experimental example, Alq3 was used by way of example. Alternatively, any one of PBD, BMB-3T, PF-6P, PyPySPyPy, COT, TPBI, a 4-diazole derivative, an anthracene derivative, TAZ, BAla, and SAlq may be used as a material having similar electron transport properties.

Subsequently, an anthracene derivative host material having a thickness of 150 Å is doped with 1 wt % of Li in order to form an n-type charge generation layer 40a.

Subsequently, an NPD material is deposited so as to have a thickness of 400 Å. At this time, the portion of the NPD material having a thickness of 50 Å is doped with 15 wt % of a p-type dopant TCNQ4 at the interface with the n-type charge generation layer 40a in order to form a p-type charge generation layer 40b, and the remaining portion of the NPD having a thickness of 350 Å is formed into a second hole transport layer 31.

Subsequently, in the same manner as in the first light-emitting layer 23, an anthracene derivative having a thickness of 400 Å, as a host, is doped with about 5 wt % of an anthracene-based fluorescent dopant, as a green dopant, in order to form a second light-emitting layer 32.

Subsequently, a second electron transport layer 33 having a thickness of 300 Å is formed on the entire region at a ratio of an electron transport material used for the first electron transport layer 24 to LiQ of 1:1.

Subsequently, 30 Å of Mg:LiF (1:1) is formed as an electron injection layer 34, and then 160 Å of Ag:Mg (3:1) is formed as a second electrode 12. In this experimental example, a capping layer 13 having a thickness of 600 Å was also formed on the second electrode 12 in order to protect the upper part of the organic light-emitting device.

Here, the first light-emitting layer 23 and the second light-emitting layer 32 are spaced apart from the interfaces with the n-type charge generation layer 40a and the p-type charge generation layer 40b in the charge generation layer 40 by distances of 300 Å and 400 Å, respectively, in order to prevent light emitted from the respective light-emitting layers from interfering with each other.

In the second comparative example shown in FIG. 2B, both the first light-emitting layer 51 of the first stack 20 and the second light-emitting layer 52 of the second stack 30 are phosphorescent light-emitting layers. In the first and second light-emitting layers 51 and 52, the same phosphorescent hosts ph are doped with the same phosphorescent dopants pd so as to have the same content. The first and second light-emitting layers 51 and 52 have the same thickness, namely 400 Å.

The second comparative example is different from the first comparative example in terms of the components constituting the first and second light-emitting layers 51 and 52. That is, the first and second light-emitting layers 51 and 52 of the second comparative example commonly include at least one phosphorescent host selected from among CBP, BCP, BeBq2, CDBP, TAZ, BAlq, and mCP, and use at least one phosphorescent dopant selected from among fac tris(2-phenylpyridine)iridium (ppy3Ir), ppy2Ir (acac), dp2Ir (acac), bzq2Ir (acac), bo2Ir (acac), op2Ir (acac), and tpy2Ir (acac). An Ir-based complex compound may be mainly used as a phosphorescent dopant. In each of the first and second light-emitting layers 51 and 52, the phosphorescent host is doped with 5 wt % of an Ir-based phosphorescent dopant.

In the third comparative example shown in FIG. 2C, the first light-emitting layer 51 of the first stack 20 is a phosphorescent light-emitting layer, and the second light-emitting layer 32 of the second stack 30 is a fluorescent light-emitting layer. In this case, the first and second light-emitting layers 51 and 32 have the same thickness, and a phosphorescent dopant and a fluorescent dopant are included in the first and second light-emitting layers 51 and 32 so as to have the same content.

In the third comparative example, a phosphorescent host is doped with 5 wt % of an Ir-based phosphorescent dopant in order to form a first light-emitting layer 51 having a thickness of 400 Å, in the same manner as in the phosphorescent light-emitting layer of the second comparative example, and an anthracene derivative having a thickness of 400 Å is doped with about 5 wt % of an anthracene-based fluorescent dopant, as a green dopant, in order to form a second light-emitting layer 32, in the same manner as in the fluorescent light-emitting layer of the first comparative example. The remainder of the construction of the third comparative example is identical to that of the first comparative example.

In the first and second embodiments of the present disclosure shown in FIGS. 3A and 3B, respectively, the first light-emitting layer 143 of the first stack 140 is a fluorescent light-emitting layer, and the second light-emitting layer 185 of the second stack 180 is a phosphorescent light-emitting layer, in contrast to the third comparative example. In this case, the first and second embodiments are different from each other in that the first light-emitting layer 143 and the second light-emitting layer 185 of the first embodiment have the same thickness and that the second light-emitting layer 185 is thicker than the first light-emitting layer 143 in the second embodiment. In both the first and second embodiments, the dopants are provided in the stacks so as to have the same content. In the first embodiment, the first stack 140 may be disposed adjacent to the second stack 180.

That is, in the first embodiment of the present disclosure shown in FIG. 3A, an anthracene derivative having a thickness of 400 Å, as a host, is doped with about 5 wt % of an anthracene-based fluorescent dopant, as a green dopant, in order to form a first light-emitting layer 143, in the same manner as in the fluorescent light-emitting layer of the first comparative example, and a phosphorescent host is doped with 5 wt % of an Ir-based phosphorescent dopant in order to form a second light-emitting layer 185 having a thickness of 400 Å, in the same manner as in the phosphorescent light-emitting layer of the second comparative example. Meanwhile, the phosphorescent host of the second light-emitting layer 185 was formed by mixing a hole transport host and an electron transport host at a ratio of 1:1. Even in the case in which a coumarin derivative, DCM, or quinacridone is used as the fluorescent dopant, in addition to the anthracene derivative, the same effects are provided.

The remainder of the construction of the first embodiment of the present disclosure is identical to that of the first comparative example.

The second embodiment of the present disclosure shown in FIG. 3B is different from the first embodiment only in that the first light-emitting layer 143 has a thickness of 300 Å. In addition, although not shown, a third embodiment of the present disclosure is different from the first embodiment in that the first light-emitting layer 143 of the third embodiment is thicker than the first light-emitting layer 143 of the first embodiment even though the second light-emitting layer 185 of the third embodiment is subjected to the same conditions as the second light-emitting layer 185 of the first embodiment.

Figure 4:
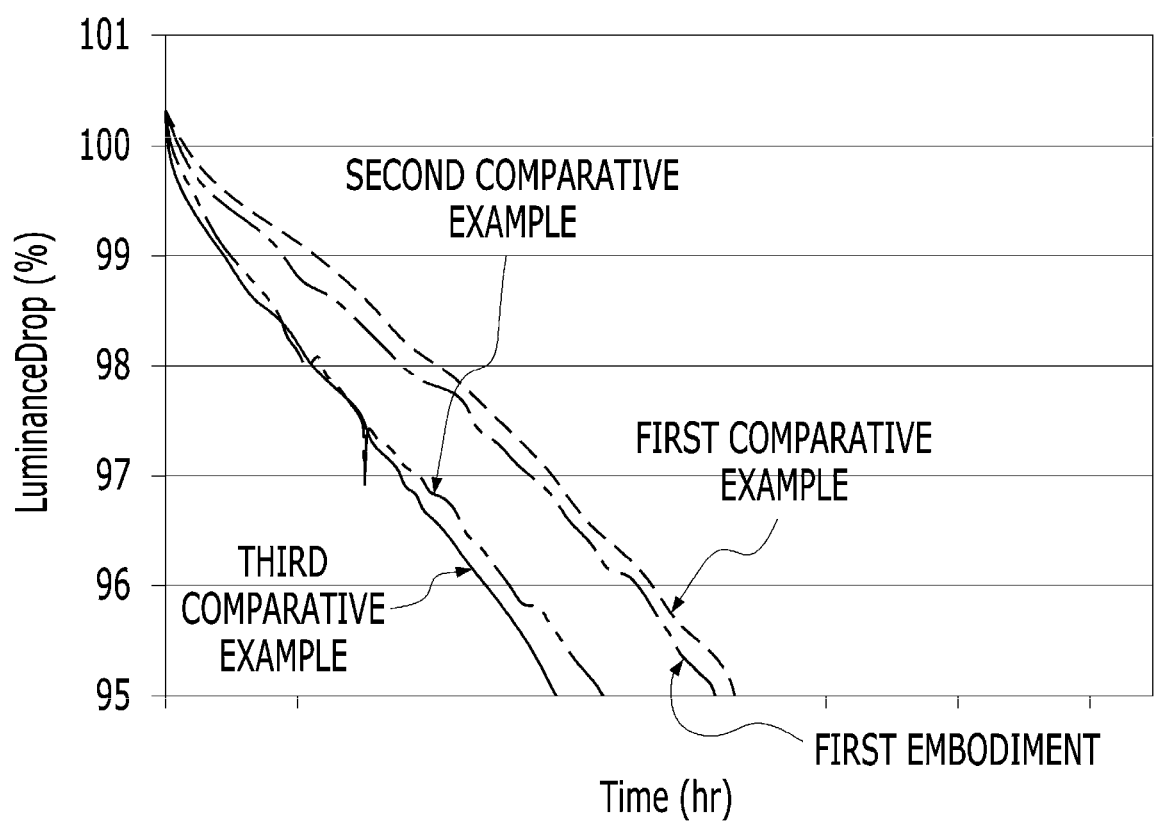
FIG. 4 is a graph showing the lifetime of the organic light-emitting devices according to the first to third comparative examples and the first embodiment of the present disclosure.

FIG. 4 is a graph showing the lifetime of the organic light-emitting devices according to the first to third comparative examples and the first embodiment of the present disclosure.

TABLE 1

| Classification | Structure | | Driving voltage (V) | Luminance (Cd/A) | CIEx | CIEy | T95 Lifetime (%) |
|---|---|---|---|---|---|---|---|
| | First light-emitting layer | Second light-emitting layer | | | | | |
| First comparative example | Fluorescent | Fluorescent | 8.7 | 103.4 | 0.244 | 0.691 | 100 |
| Second comparative example | Phosphorescent | Phosphorescent | 6.0 | 213.1 | 0.244 | 0.708 | 75 |
| Third comparative example | Phosphorescent | Fluorescent | 6.6 | 164.1 | 0.239 | 0.706 | 70 |
| First embodiment | Fluorescent | Phosphorescent | 7.4 | 184.7 | 0.240 | 0.710 | 99 |

Referring to FIG. 4 and Table 1, it is advantageous in terms of lifetime for fluorescent light-emitting layers to be used as both the first and second light-emitting layers of the stacks, as in the first comparative example. In this case, however, the driving voltage is high and luminance is low. As a result, it is necessary to consider another structure. In contrast, in the case in which phosphorescent light-emitting layers are used as both the first and second light-emitting layers of the stacks, as in the second comparative example, driving voltage and luminance are good, but the lifetime is about ¾ of the lifetime of the first comparative example. Consequently, it can be seen that the second comparative example is not suitable for a multi-stack structure, which requires a long lifetime.

In the third comparative example, a phosphorescent light-emitting layer is used as the first light-emitting layer and a fluorescent light-emitting layer is used as the second light-emitting layer, in order to achieve both low driving voltage of the phosphorescent light-emitting layer and long lifetime of the fluorescent light-emitting layer. It is possible to obtain lower driving voltage and higher luminance than in the structure in which fluorescent light-emitting layers are applied to the stacks (the first comparative example). However, the lifetime is lower than in the structure in which phosphorescent light-emitting layers are applied to the stacks (the second comparative example). Consequently, it can be seen that it is not possible to complementarily use all of the advantages of different kinds of light-emitting layers with the configurations shown in the first to third comparative examples.

In the organic light-emitting device according to the present disclosure, a fluorescent light-emitting layer and a phosphorescent light-emitting layer are used as the first light-emitting layer 143 of the first stack 140 and the second light-emitting layer 185 of the second stack 180, respectively, as in the first embodiment. As a result, it is possible to obtain almost the same lifetime as the first comparative example, in which the fluorescent light-emitting layers are applied to both stacks. In addition, it can be seen that efficiency is 12.6% higher than in the third comparative example and that efficiency is 78.6% higher than in the first comparative example. The driving voltage is also higher than in the third comparative example. However, the driving voltage is only 12.1% higher than in the third comparative example, which does not amount to a substantial difference in efficiency compared to the third comparative example. In addition, the advantage of increased light emission efficiency greatly offsets a reduction in power efficiency due to an increase in driving voltage, and high efficiency and a long lifetime are obtainable. Consequently, the first embodiment of the present disclosure is superior to the first to third comparative examples.

Meanwhile, CIEx and CIEy of the comparative examples and the embodiment of the present disclosure, which were not described, indicate color coordinate values corresponding to the same level of green light emission.

In the experimental example, the T95 lifetime is the amount of time taken until luminance reaches 95% of the initial luminance. A larger amount of time means that the reduction in the efficiency of the device over time is small. The above experimental results reveal that the first embodiment of the present disclosure has almost the same lifetime as the structure in which the fluorescent light-emitting layers are used in the respective stacks and almost the same level of efficiency as the structure in which the phosphorescent light-emitting layers are used in the respective stacks. Consequently, it can be seen that the structure in which the fluorescent light-emitting layer and the phosphorescent light-emitting layer are used in combination is effective.

Hereinafter, the meaning of the second embodiment of the present disclosure, which is a modification of the first embodiment, which is configured to have a low driving voltage, will be described.

In the first embodiment, the first and second light-emitting layers 143 and 185, respectively, have the same thickness. However, the second embodiment, which is shown in FIG. 3B, is different from the first embodiment in that the phosphorescent light-emitting layer 185, as the second light-emitting layer, is thicker than the fluorescent light-emitting layer 143, as the first light-emitting layer. Meanwhile, a third embodiment has the same stack structure as shown in FIG. 3A, but is different from the first embodiment in that the fluorescent light-emitting layer 143, as the first light-emitting layer, has a thickness of 500 Å, which is greater than the thickness of the phosphorescent light-emitting layer 185, as the second light-emitting layer, which is 400 Å.

Figure 5:
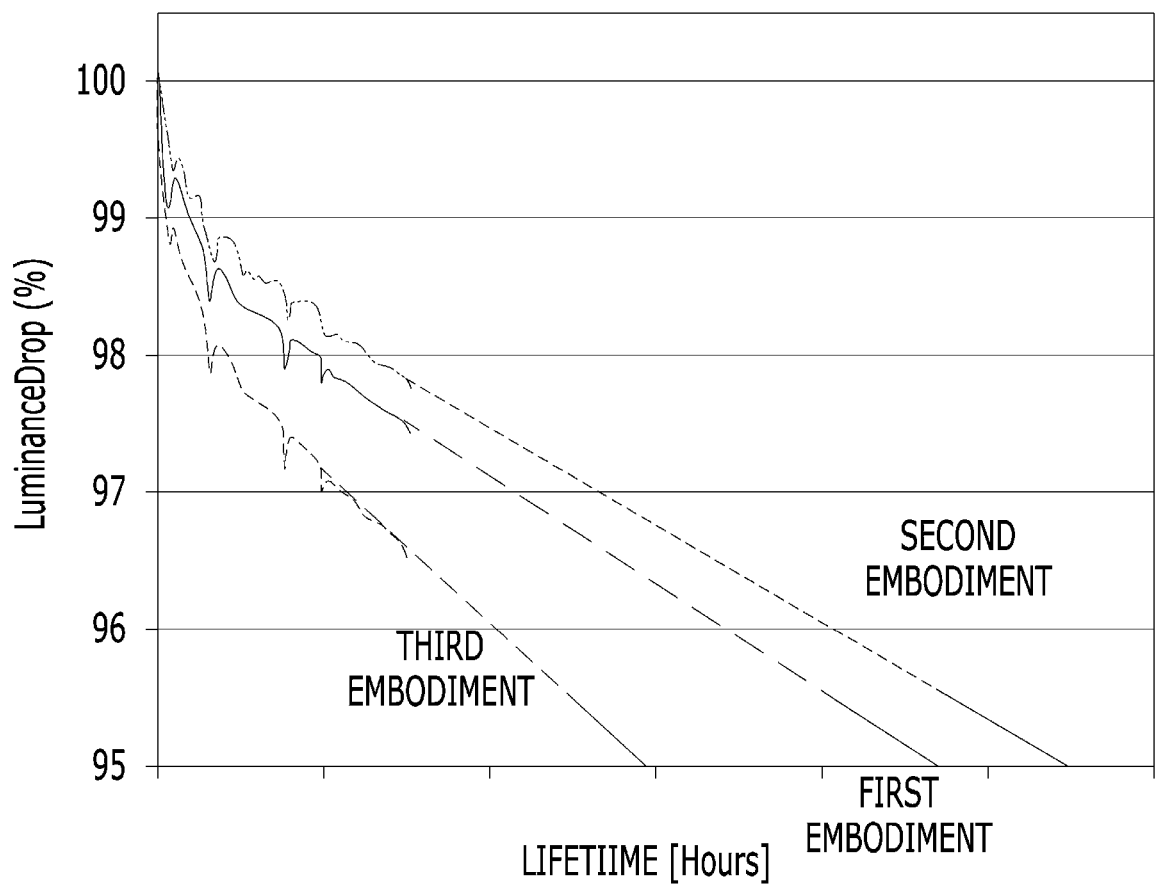
FIG. 5 is a graph showing the lifetime of organic light-emitting devices according to first to third embodiments of the present disclosure.

FIG. 5 is a graph showing the lifetime of organic light-emitting devices according to the first to third embodiments of the present disclosure.

TABLE 2

| Classification | First light-emitting layer (fluorescent) (Å) | Second light-emitting layer (phosphorescent) (Å) | Driving voltage (V) | Efficiency (Cd/A) | CIEx | CIEy | T95 Lifetime (%) |
|---|---|---|---|---|---|---|---|
| First embodiment | 400 | 400 | 7.4 | 184.7 | 0.240 | 0.710 | 100 |
| Second embodiment | 300 | 400 | 6.8 | 202.0 | 0.244 | 0.708 | 120 |
| Third embodiment | 500 | 400 | 7.9 | 164.1 | 0.239 | 0.706 | 70 |

It can be seen from Table 2 and FIG. 5 that, on the assumption that T95 lifetime of the first embodiment, in which the first and second light-emitting layers 143 and 185, respectively, have the same thickness of 400 Å, is 100%. Whereas, in the case in which the thickness of the first light-emitting layer 143 is decreased to 300 Å, the lifetime is 20% higher than in the first embodiment. Here, it can be seen that the second embodiment has lower driving voltage and higher efficiency than the first embodiment, in addition to longer T95 lifetime.

In contrast, in the case in which the thickness of the first light-emitting layer is increased to 500 Å, the lifetime is 30% lower than in the first embodiment, but the driving voltage is higher than in the first embodiment, whereby efficiency is lower than in the first embodiment. When, in a multi-stack structure, a fluorescent light-emitting layer is applied to a lower stack and a phosphorescent light-emitting layer is applied to an upper stack, as in the organic light-emitting device according to the present disclosure, therefore, it can be seen that the case in which the thickness of the fluorescent light-emitting layer is less than the thickness of the phosphorescent light-emitting layer is more effective. That is, in the presented experimental example, the second embodiment, in which the thickness of the second light-emitting layer 185 is 400 Å and the thickness of the first light-emitting layer 143 is 300 Å, exhibits the highest efficiency. As previously described, the first embodiment of the present disclosure having the structure shown in FIG. 3A exhibits higher overall performance in terms of lifetime and efficiency than the comparative examples. The second embodiment of the present disclosure exhibits higher overall performance in terms of lifetime and efficiency than the first embodiment of the present disclosure. Consequently, it can be seen that the second embodiment of the present disclosure exhibits much higher efficiency and lifetime performance than the comparative examples.

Figure 6:
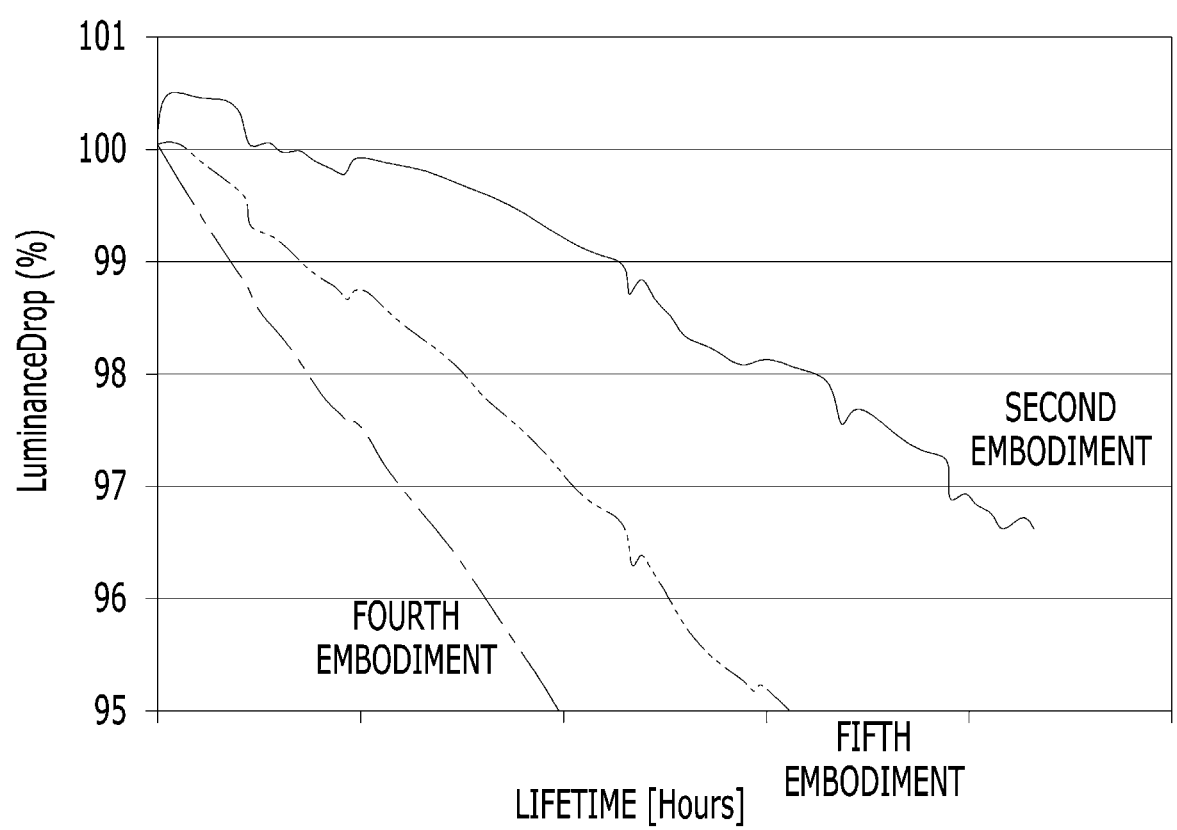
FIG. 6 is a graph showing the lifetime of organic light-emitting devices according to fourth, fifth, and second embodiments of the present disclosure.

FIG. 6 is a graph showing the lifetime of organic light-emitting devices according to fourth, fifth, and second embodiments of the present disclosure.

In the following experimental example, the first light-emitting layers 143 (fluorescent light-emitting layers) of the organic light-emitting devices according to the fourth, fifth, and second embodiments of the present disclosure have the same thickness of 300 Å, and the second light-emitting layers 185 (phosphorescent light-emitting layers) of the organic light-emitting devices according to the fourth, fifth, and second embodiments have thicknesses of 200 Å, 300 Å, and 400 Å, respectively. In this case, the thickness of each of the fluorescent light-emitting layers 143 is less than the thickness of the fluorescent light-emitting layer of the first embodiment, whereby the driving voltage is lower than the driving voltage in the first and third embodiments. In the case in which each of the second light-emitting layers 185, i.e. the phosphorescent light-emitting layers, is reduced, however, it is not possible to realize sufficient efficiency.

That is, in the case in which the fluorescent light-emitting layer 143 located adjacent to the first electrode 110 has a thickness of 300 Å or less, as in the fourth, fifth, and second embodiments, it can be seen that it is possible to prevent an increase in driving voltage, as shown in Table 3 and FIG. 6. In addition, in the case in which the phosphorescent light-emitting layer 185 has the same thickness as the fluorescent light-emitting layer 143 or a larger thickness than the fluorescent light-emitting layer 143, e.g. 300 to 400 Å, it can be seen that efficiency is improved. Furthermore, in the case in which the phosphorescent light-emitting layer 185 is thicker than the fluorescent light-emitting layer 143, it can be seen that the lifetime is further increased, as shown in FIG. 6.

ally increases from the period in which the distances a and b are the same, i.e. 40 nm (400 Å), the variation in efficiency is insignificant, but that, in the case in which the distance b from the interface between the n-type charge generation layer 160a and the p-type charge generation layer 160b to the light-emitting layer 143 of the first stack 140 increases, the variation in efficiency becomes significant.

In this case, the thickness ratio of a:b is changed for efficiency comparison, on the assumption that efficiency is 100% in the case which the distance between adjacent light-emitting layers 143 and 185 is fixed to 80 nm (800 Å), the distance a from the interface between the n-type charge generation layer 160a and the p-type charge generation layer 160b to the light-emitting layer 185 of the second stack 180 is 55 nm (550 Å), and the distance b from the interface between the n-type charge generation layer 160a and the p-type charge generation layer 160b to the light-emitting layer 143 of the first stack 140 is 25 nm (250 Å), in the structure of the first embodiment of the present disclosure shown in FIG. 3A. In this case, the thickness of the first electron transport layer 144 of the first stack 140 may be 10 nm (100 Å), and the thickness of the second hole transport layer 184 of the second stack 180 may be 50 nm (500 Å). Meanwhile, even in the case in which the distance b from the interface between the n-type charge generation layer 160a and the p-type charge generation layer 160b to the light-emitting layer 143 of the first stack 140 is 45 nm (250 Å) and in which the distance a from the interface between the n-type charge generation layer 160a and the p-type charge generation layer 160b to the light-emitting layer 185 of the second stack 180 is 35 nm (350 Å), it can be seen that it is possible to obtain an efficiency of 100%. The larger the distance b, however, the greater the variation in efficiency. Consequently, the distance b may be set to a range between 20 nm (200 Å) and 45 nm (450 Å). That is, the distance from the interface between the n-type charge generation layer 160a and the p-type charge generation layer 160b to the first

TABLE 3

| Classification | First light-emitting layer (fluorescent) (Å) | Second light-emitting layer (phosphorescent) (Å) | Driving voltage (V) | Efficiency (Cd/A) | CIEx | CIEy |
|---|---|---|---|---|---|---|
| Fourth embodiment | 300 | 200 | 6.8 | 128.8 | 0.247 | 0.699 |
| Fifth embodiment | 300 | 300 | 6.8 | 144.3 | 0.242 | 0.709 |
| Second embodiment | 300 | 400 | 6.8 | 202.0 | 0.244 | 0.708 |

Figure 7:
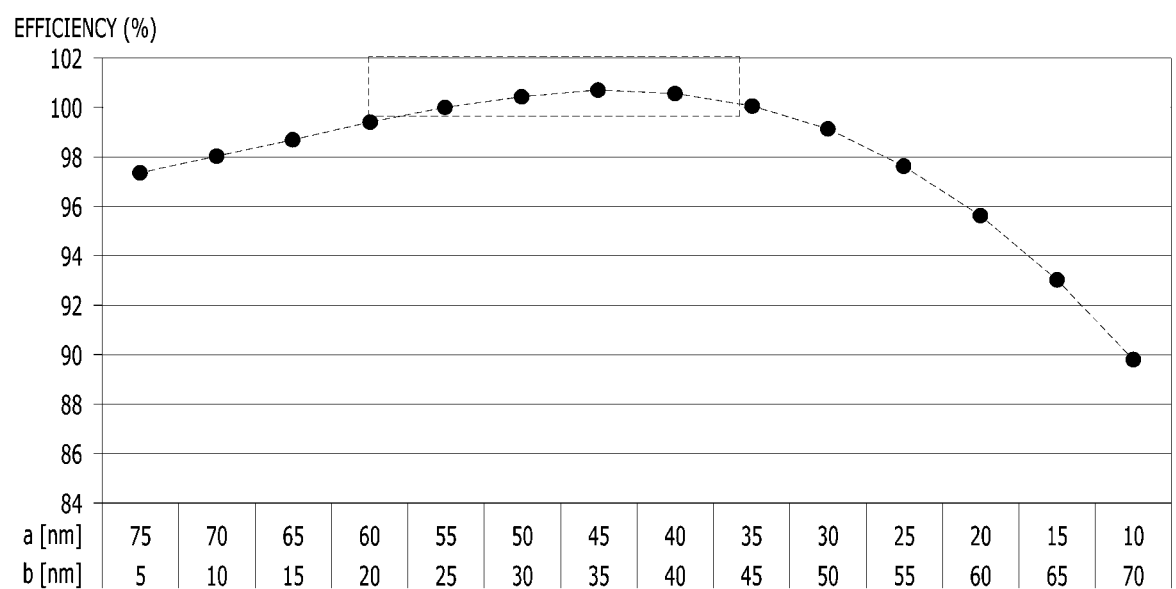
FIG. 7 is a graph showing the efficiency of the organic light-emitting device depending on the thickness relationship of a:b of FIG. 3A.

FIG. 7 is a graph showing the efficiency of the organic light-emitting device depending on the thickness relationship of a:b of FIG. 3A.

FIG. 7 shows the efficiency of the organic light-emitting device according to the present disclosure depending on the distance a from the interface between the n-type charge generation layer 160a and the p-type charge generation layer 160b to the light-emitting layer 185 of the second stack 180 and the distance b from the interface between the n-type charge generation layer 160a and the p-type charge generation layer 160b to the light-emitting layer 143 of the first stack 140.

It should be noted that, in the case in which the distance a between the interface from the n-type charge generation layer 160a and the p-type charge generation layer 160b to the light-emitting layer 185 of the second stack 180 gradulight-emitting layer 143 is 200 Å or more. In order to obtain an efficiency of more than 100%, the distance a may be greater than or equal to the distance b. In this case, the distance a may be set to be equal to the distance b or to be 2.2 or less times the distance b.

The above experiments related to the distances a and b were made in a structure in which a common layer is applied to all subpixels, excluding the light-emitting layers, in the distance between the light-emitting layers of adjacent stacks. The experiments were carried out under the condition in which the distance a+b between the light-emitting layers of adjacent stacks was set to 800 Å. However, the present disclosure is not limited thereto. For example, in the case in which subpixels having different colors each have an auxiliary hole transport layer, in addition to a common layer, and the auxiliary hole transport layer is selectively provided at a specific subpixel, the distance a+b between the light-emitting layers of the adjacent stacks may be changed to 800 to 1200 Å. That is the distance from the first light-emitting layer 143 to the second light-emitting layer 185 ranges from 800 Å to 1200 Å. Here, "adjacent stacks" means a structure in which a fluorescent stack is located at the lower side and in which a phosphorescent stack abutting on the exit side is located at the upper side, as shown in FIGS. 3A and 3B, and the distance a+b between the light-emitting layers of the adjacent stacks means the distance from the upper surface of the fluorescent light-emitting layer to the lower surface of the phosphorescent light-emitting layer of the adjacent stacks.

Meanwhile, the structure of the organic light-emitting device according to the present disclosure is advantageous in terms of viewing angle as well as efficiency, driving voltage, and the lifetime, as described above.

Figure 8:
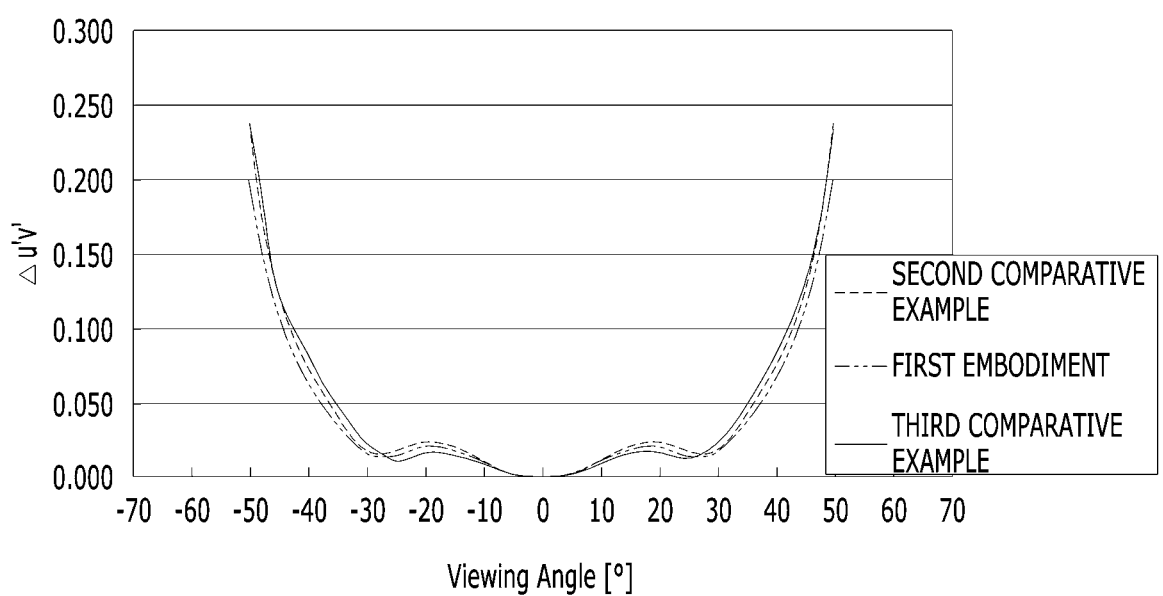
FIG. 8 is a graph showing Δu'v' based on a viewing angle when the second and third comparative examples and the first embodiment of the present disclosure are applied.
Figure 9:
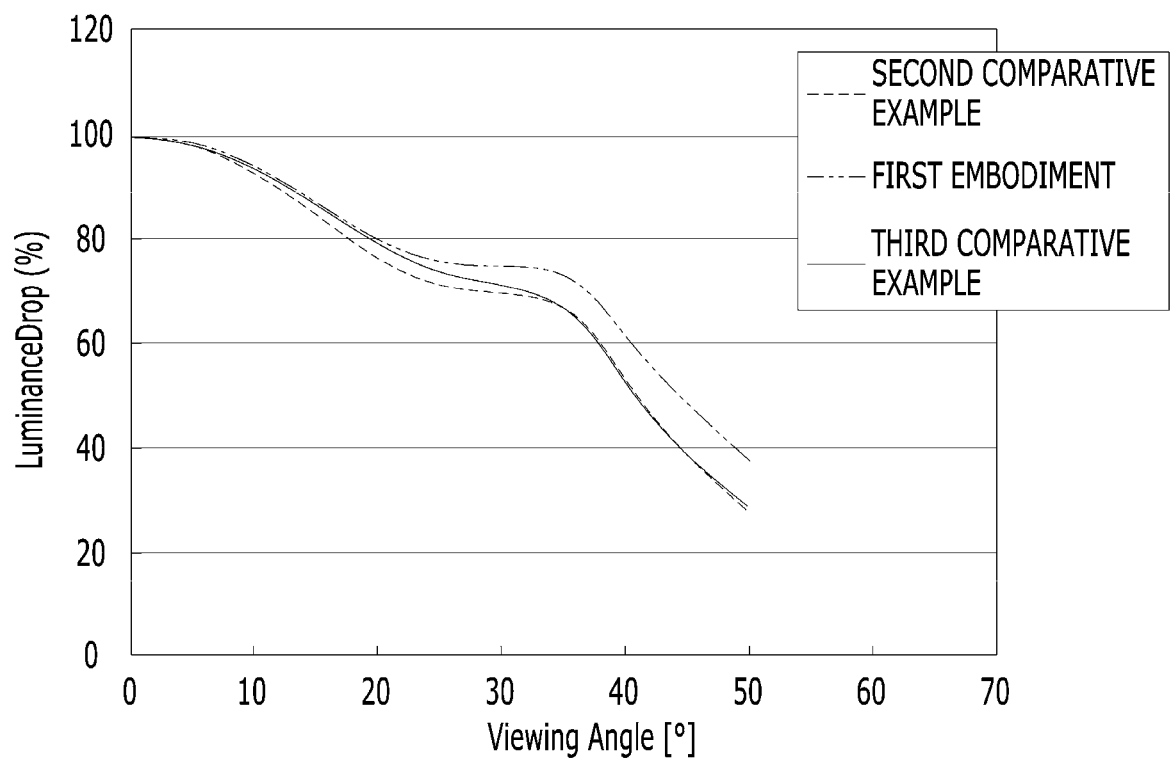
FIG. 9 is a graph showing a change in luminance drop rate based on a viewing angle when the second and third comparative examples and the first embodiment of the present disclosure are applied.

FIG. 8 is a graph showing Δu'v' based on a viewing angle when the second and third comparative examples and the first embodiment of the present disclosure are applied, and FIG. 9 is a graph showing a change in luminance drop rate based on a viewing angle when the second and third comparative examples and the first embodiment of the present disclosure are applied.

A viewing angle is an angle at which a screen is viewed from the side, rather than the front. That is, the front has a viewing angle of 0 degrees, and the maximum viewing angle is 90 degrees. Since bilateral symmetry is provided based on the front, a left viewing angle and a right viewing angle are generally symmetrical. As shown in FIGS. 8 and 9, luminance is almost linearly reduced until a viewing angle is increased from 0 degrees to 20 degrees, is not greatly changed until the viewing angle is increased to 35 degrees, and is greatly reduced when the viewing angle exceeds 35 degrees.

In the second comparative example, in which phosphorescent light-emitting layers are used in the stacks, luminance drop and luminance variation characteristics based on the viewing angle are the worst, even though efficiency is improved. That is, in the second comparative example, a color viewing angle deviation Δu'v' at a viewing angle of 50 degrees, which is the largest in the experimental example, is 0.236, and a luminance value is 28% of the luminance value based on the front.

TABLE 4

| Structure (First light-emitting layer/Second light-emitting layer) | Color viewing angle (Δu'v' at 50°) | Luminance drop (at 50°) |
| --- | --- | --- |
| Phosphorescent EML/Phosphorescent EML (Second comparative example) | 0.236 | 28% |
| Phosphorescent EML/Fluorescent EML (Third comparative example) | 0.234 | 29% |
| Fluorescent EML/Phosphorescent EML (First embodiment) | 0.200 | 38% |

In addition, even in the case in which the fluorescent light-emitting layer and the phosphorescent light-emitting layer are used in combination, there is a great difference depending on the position at which the phosphorescent light-emitting layer is disposed. In the case in which the fluorescent light-emitting layer is located at the exit side and the phosphorescent light-emitting layer is located in the lower stack, as in the third comparative example, Δu'v' at a viewing angle of 50 degrees is 0.234 or higher, and the intensity of luminance is 29% of the intensity of luminance based on the front. That is, it can be seen that the luminance drop and variation characteristics due to a change in the viewing angle are not good.

In contrast, in the first embodiment of the present disclosure, it can be seen that Δu'v', which indicates color purity variation characteristics in the entire viewing-angle region, is lower than those in the second and third comparative examples and that Δu'v' at a viewing angle of 50 degrees, which is the largest in the experiment, is 0.200, which means that color purity deviation is low, and the luminance drop is 38% of the luminance drop based on the front. Consequently, it can be seen that both color purity and luminance characteristics are improved.

Figure 10:
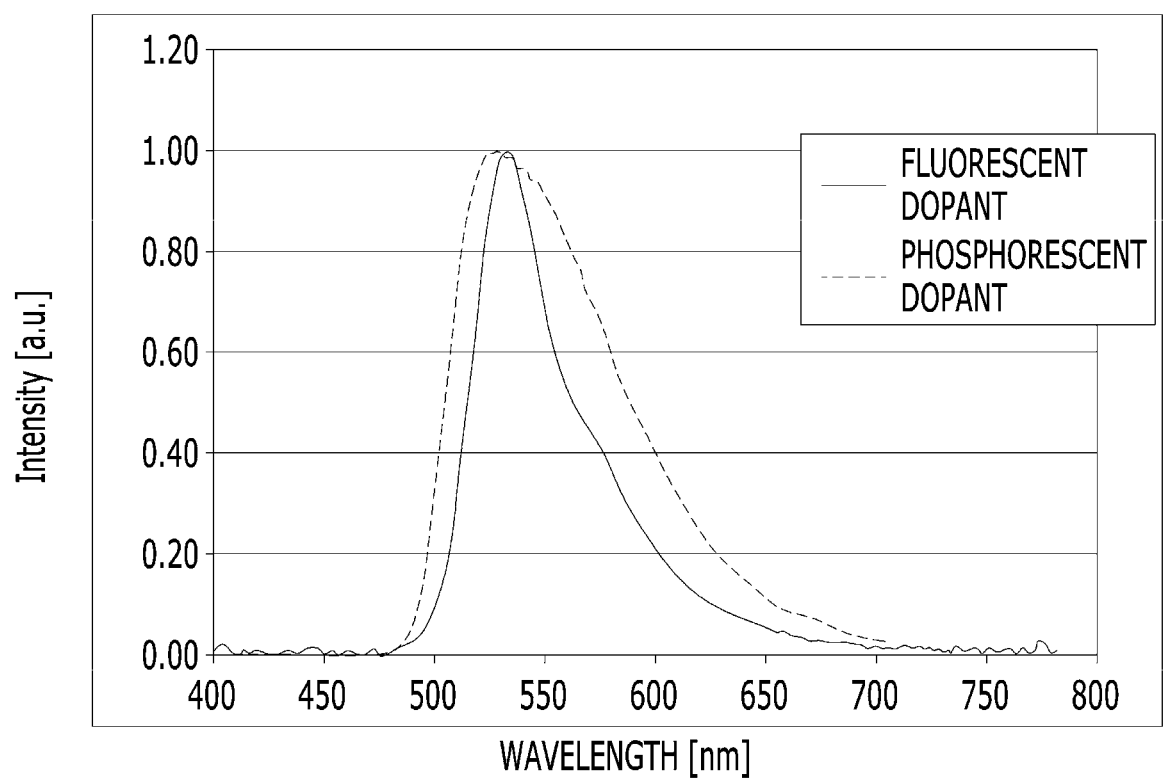
FIG. 10 is a graph showing peak spectra of a fluorescent dopant and a phosphorescent dopant at a green wavelength.

FIG. 10 is a graph showing peak spectra of a fluorescent dopant and a phosphorescent dopant at a green wavelength.

FIG. 10 shows peak spectra of a fluorescent dopant and a phosphorescent dopant that emit green light. The phosphorescent dopant has a peak light emission at a shorter wavelength than the fluorescent dopant, and the full width at half maximum (FWHM) of the phosphorescent dopant covers the FWHM of the fluorescent dopant, which means that the light emission intensity of the phosphorescent dopant is greater than the light emission intensity of the fluorescent dopant at a wider wavelength, and means that the phosphorescent light-emitting layer affects intensity more than the fluorescent light-emitting layer on the assumption that the fluorescent light-emitting layer and the phosphorescent light-emitting layer have the same thickness and are located at the same position. Consequently, the organic light-emitting device according to the present disclosure is configured to have a structure in which, in the case in which light-emitting layers that emit light of the same color are applied to a plurality of stacks, a phosphorescent light-emitting layer at the exit side is thicker than a fluorescent light-emitting layer provided in any one of the other stacks.

Hereinafter, an organic light-emitting display device to which the organic light-emitting device is applied will be described.

The organic light-emitting device has been described based on a stacked structure of a single subpixel, and an example in which green light-emitting layers are applied to a plurality of stacks has been described in connection with the experimental example. However, the present disclosure is not limited thereto. A red subpixel and a blue subpixel may be configured such that a fluorescent light-emitting layer is applied to a lower stack and a phosphorescent light-emitting layer is applied to an upper stack, which is close to the exit side, in the same manner as in the green subpixel. The structure in which the fluorescent light-emitting layer and the phosphorescent light-emitting layer are provided in combination may be applied to a single subpixel, to all subpixels, or to two or more subpixels.

Figure 11:
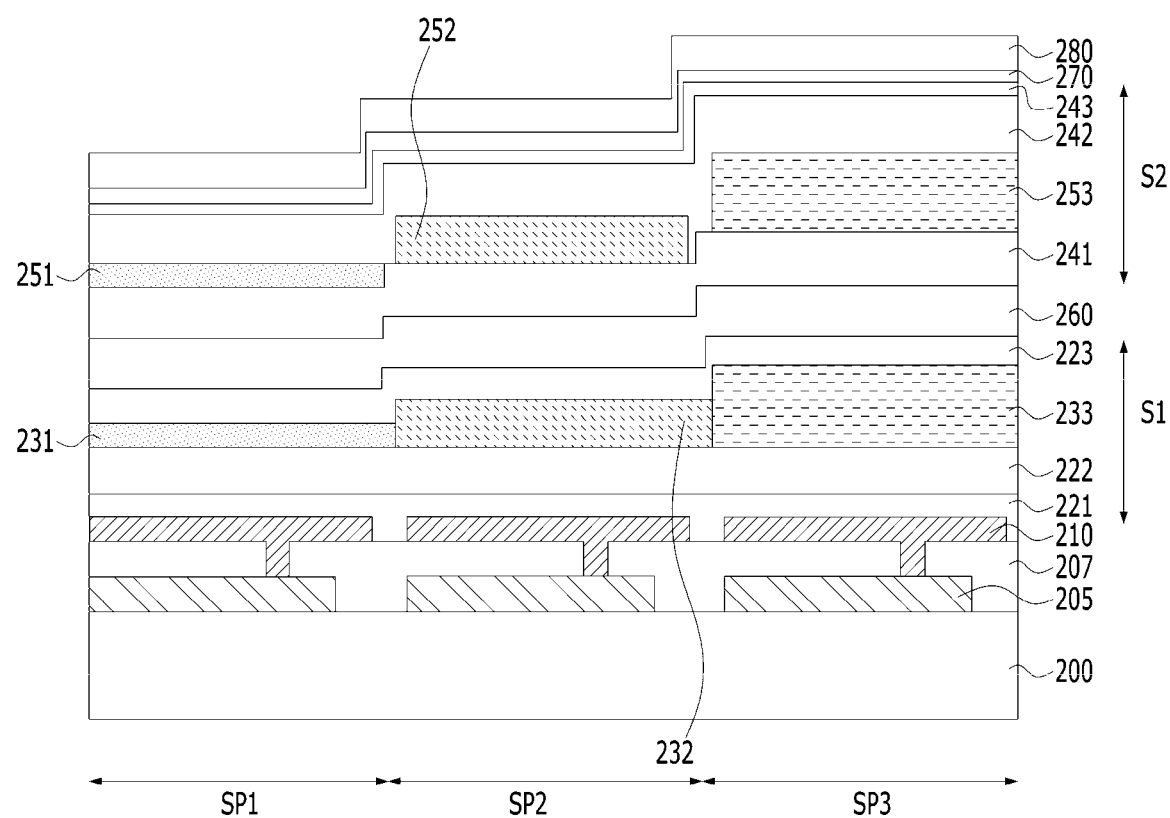
FIG. 11 is a sectional view showing an organic light-emitting display device according to the present disclosure.

FIG. 11 is a sectional view showing an organic light-emitting display device according to the present disclosure.

As shown in FIG. 11, the organic light-emitting display device according to the present disclosure includes a substrate 100 having regularly arranged first to third subpixels SP1, SP2, and SP3, a thin film transistor 205 provided at each of the first to third subpixels, and an organic light-emitting device (OLED) electrically connected to the thin film transistor 205 through a contact hole in a passivation layer 207 at each of the first to third subpixels. A first electrode 210 of the OLED is directly connected to the thin film transistor 205 by the contact hole in the passivation layer 207.

FIG. 11 shows an organic light-emitting device (OLED) having a two-stack structure. The organic light-emitting device includes a first electrode 210, a second electrode 270 opposite the first electrode 210, the second electrode 270 being used as an exit side, first to n-th stacks S1 and S2 disposed between the first and second electrodes 210 and 270, the first to n-th stacks having light-emitting layers, and a charge generation layer 260 disposed between neighboring ones of the first to n-th stacks, the charge generation layer 260 including an n-type charge generation layer (see 160*a* of FIG. 1) and a p-type charge generation layers (see 160*b* of FIG. 1). As shown in FIG. 11, the charge generation layer 260 between the first stack and the second stack is commonly disposed on the first electrode 210 of the first subpixel SP1, the first electrode 210 of the second subpixel SP2, and the first electrode 210 of the third subpixel SP3.

Since the first electrode 210 is provided at the subpixels SP1, SP2, and SP3 in an electrically divided fashion, the organic light-emitting device, which is configured to have a vertical structure between the first and second electrodes 210 and 270 of each subpixel, independently functions for each subpixel even in the case in which organic layers between the first electrode 210 and the second electrode 270 are commonly provided at neighboring subpixels.

Layers between the light-emitting layers 231, 232, and 233 and 251, 252, and 253 of the stacks, excluding the first electrode 210 and light-emitting layers 231, 232, 233, 251, 252, and 253 of the stacks, are common layers that are commonly formed without being separated from the first to third subpixels.

A hole injection layer 221 and a first hole transport layer 222 are commonly provided between the first electrode 210 and the first light-emitting layers 231, 232, and 233, and a first electron transport layer 223, the charge generation layer 260, and a second hole transport layer 241 are commonly provided between the first light-emitting layers 231, 232, and 233 and the second light-emitting layers 251, 252, and 253.

In addition, in the case in which at least three stacks are provided between the first and second electrode 210 and 270 in the same manner, the construction between the light-emitting layers of neighboring stacks is repeated in the same manner. That is, the first subpixel SP1, the second subpixel SP2, and the third subpixel SP3 may share a common hole injection layer 221 on the first electrodes 210, a common first hole transport layer 222 on the common hole injection layer 221, and a common first electron transport layer on the first light-emitting layers 231, 232, 233 in the first stack of each subpixel. Additionally, the three subpixels SP1, SP2, SP3 share a common second hole transport layer 242 on the common first electron transport layer 223, a common second electron transport layer 242 on the second light-emitting layers 251, 252, 253, and a common electron injection layer 243 on the common second electron transport layer 252 in the second stack of each subpixel.

In the last stack (i.e. the n-th stack), an (n-1)-th electron transport layer 242 and an electron injection layer 243 are provided between the red, green, and blue phosphorescent light-emitting layers and the second electrode 270.

In addition, each of the light-emitting layers 231, 232, 233 . . . of the first to n-th stacks of the respective first to third subpixels SP1, SP2, and SP3, emit light of the same color. The light-emitting layer of the n-th stack of at least one of the first to third subpixels is a phosphorescent light-emitting layer, and the light-emitting layer of at least one of the first to (n-1)-th stacks is a fluorescent light-emitting layer. Additionally, a first light-emitting layer 231 of the first subpixel SP1, the first light-emitting layer 232 of the second subpixel SP2, and the first light-emitting layer 233 of the third subpixel SP3 may all have different thicknesses. Also, a second light-emitting layer 251 of the first subpixel SP1, a second light-emitting layer 252 of the second subpixel SP2, and a second light-emitting layer 253 of the third subpixel SP3 may all have different thicknesses.

In the case in which the distances from the interfaces between the n-type charge generation layers and the p-type charge generation layers of the charge generation layers to the light-emitting layers of the stacks adjacent thereto are the same, or the distance from the interfaces between the n-type charge generation layers and the p-type charge generation layers of the charge generation layers to the light-emitting layer of the stack close to the second electrode is greater than the distance from the interfaces between the n-type charge generation layers and the p-type charge generation layers of the charge generation layers to the light-emitting layer of the stack close to the first electrode, as described with reference to FIG. 1, the efficiency of the organic light-emitting device is excellent.

Here, the first to third subpixels have first to third light-emitting layers 231, 232, and 233/251, 252, and 253 that emits light of different colors, such as blue, green, and red, for corresponding ones of the first to n-th stacks. The first to third light-emitting layers 231, 232, and 233/251, 252, and 253 may have different thicknesses. The reason for this is that wavelengths for the emitted colors have different resonance cycles. In the case in which the wavelength is shorter, the light-emitting layer is provided so as to have a smaller thickness.

Meanwhile, a capping layer 280 is provided on the second electrode 270 for protecting the organic light-emitting device and improving the optical efficiency of the organic light-emitting device.

In the organic light-emitting display device according to the present disclosure, light-emitting layers that emit light of the same color are applied to a plurality of stacks in order to realize the same luminance, whereby the magnitude of current flowing in each light-emitting layer is reduced. Consequently, deterioration of the organic light-emitting device, which is caused when the organic light-emitting device emits light, is delayed, whereby the lifetime of the organic light-emitting device is increased.

In this case, at least one subpixel provided in the organic light-emitting display device is configured such that a phosphorescent light-emitting layer is provided at the exit side and a fluorescent light-emitting layer is provided in at least one of the other stacks in order to simultaneously achieve improvements in lifetime and in efficiency. In the case in which different kinds of light-emitting layers, i.e. a fluorescent light-emitting layer and a phosphorescent light-emitting layer, are applied to the stacks, the thickness of the fluorescent light-emitting layer, which has lower efficiency than the phosphorescent light-emitting layer, may be reduced, whereby driving voltage may also be reduced.

The organic light-emitting device according to the present disclosure and the organic light-emitting display device using the same are configured to have the above structures. As a result, it is possible to exhibit both the long-lifetime characteristics of fluorescence and the high-efficiency characteristics of phosphorescence. In particular, it is possible to realize high display quality by optimizing the positions of the light-emitting layers.

As is apparent from the above description, an organic light-emitting device according to the present disclosure and an organic light-emitting display device using the same have the following effects.

First, light-emitting layers that emit light of the same color are applied to a plurality of stacks, whereby it is possible to minimize the magnitude of current required at the same luminance, compared to a single-stack device. Consequently, it is possible to improve the efficiency that is obtainable from the organic light-emitting device itself, which is advantageous in realizing high resolution.

Second, in the case in which light-emitting layers that emit light of the same color are applied to a plurality of stacks, a phosphorescent light-emitting layer is used as a light-emitting layer of a stack close to the exit side, and a fluorescent light-emitting layer is used as a light-emitting layer of at least one of the other stacks, whereby it is possible to realize both the high-efficiency characteristics of phosphorescence and the long-lifetime characteristics of fluorescence. In the case in which the phosphorescent light-emitting layer and the fluorescent light-emitting layer are provided at specific positions, it is possible to effectively prevent a luminance drop due to a viewing angle, which may occur in the stack structure, and at the same time to improve ability to withstand high temperatures. Consequently, it is possible to realize a high-efficiency, long-lifetime organic light-emitting device that is applicable to a display device.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present disclosure.

What is claimed is:

1. An organic light-emitting device comprising:
   a first electrode;
   a second electrode opposite the first electrode, the second electrode being used as an exit side;
   first to n-th (n being a natural number equal to or greater than 2) stacks disposed between the first electrode and the second electrode, each of the first to n-th stacks having light-emitting layers that emit light having a same color; and
   (n-1) charge generation layers disposed between neighboring ones of the first to n-th stacks, each of the (n-1) charge generation layers comprising an n-type charge generation layer and a p-type charge generation layer, wherein
   the second electrode abuts on the n-th stack,
   the light-emitting layer of the n-th stack is a phosphorescent light-emitting layer comprising at least one phosphorescent host and a phosphorescent dopant that emits light including a first wavelength,
   the light-emitting layer of at least the (n-1)-th stack is a fluorescent light-emitting layer comprising at least one fluorescent host and a fluorescent dopant that emits light including the first wavelength,
   distances from an interface between the n-type charge generation layer and the p-type charge generation layer of the (n-1)-th charge generation layer to the light-emitting layers of the n-th stack and the (n-1)-th stacks adjacent thereto are the same, or a distance from the interface between the n-type charge generation layer and the p-type charge generation layer to the light-emitting layer of the n-th stack is greater than a distance from the interface between the n-type charge generation layer and the p-type charge generation layer to the light-emitting layer of the (n-1)-th stack, and
   the phosphorescent dopant of the phosphorescent light-emitting layer in the n-th stack has a peak light emission at a lower wavelength than the fluorescent dopant of the fluorescent light-emitting layer in the (n-1)-th stack.

2. The organic light-emitting device according to claim 1, wherein the distance from the interface between the n-type charge generation layer and the p-type charge generation layer to the light-emitting layer of the n-th stack is 2.2 or less times distance from the interface between the n-type charge generation layer and the p-type charge generation layer to the light-emitting layer of the (n-1)-th stack.

3. The organic light-emitting device according to claim 1, wherein the phosphorescent light-emitting layer of the n-th stack is thicker than the fluorescent light-emitting layer of the at least one of the first to (n-1)-th stacks.

4. The organic light-emitting device according to claim 1, wherein a full width at half maximum of an emission spectrum of the phosphorescent light-emitting layer comprises a full width at half maximum of an emission spectrum of the fluorescent light-emitting layer.

5. The organic light-emitting device according to claim 2, wherein a distance between a lower surface of the phosphorescent light-emitting layer of the n-th stack and an upper surface of the fluorescent light-emitting layer of the (n-1)-th stack ranges from 800 Å to 1200 Å.

6. The organic light-emitting device according to claim 5, wherein a distance from the interface between the n-type charge generation layer and the p-type charge generation layer to the fluorescent light-emitting layer of the (n-1)-stack is 200 Å or more.

7. An organic light-emitting display device comprising:
   a substrate having regularly arranged first to third subpixels;
   a thin film transistor provided at each of the first to third subpixels; and
   first to third organic light-emitting devices, each of which is electrically connected to the thin film transistor at a corresponding one of the first to third subpixels, each of the first to third organic light-emitting devices comprising a first electrode, a second electrode opposite the first electrode, the second electrode being used as an exit side, first to n-th (n being a natural number equal to or greater than 2) stacks disposed between the first and second electrodes, the first to n-th stacks having light-emitting layers that emit light having a same color, and (n-1) charge generation layers disposed between neighboring ones of the first to n-th stacks, each of the (n-1) charge generation layers comprising an n-type charge generation layer and a p-type charge generation layer,
   wherein the light-emitting layers in the first to n-th stacks of each of the first to third subpixels emit light having a same color, and
   wherein, in at least one of the first to third subpixels,
   the second electrode abuts on the n-th stack,
   the light-emitting layer of the n-th stack is a phosphorescent light-emitting layer comprising at least one phosphorescent host and a phosphorescent dopant that emits light including a first wavelength,
   the light-emitting layer of at least the (n-1)-th stack is a fluorescent light-emitting layer comprising at least one fluorescent host and a fluorescent dopant that emits light including the first wavelength,
   distances from an interface between the n-type and p-type charge generation layers of the (n-1)-th charge generation layer to the light-emitting layers of the n-th stack and the (n-1)-th stacks adjacent thereto are the same, or a distance from the interface between the n-type charge generation layer and the p-type charge generation layer to the light-emitting layer of the n-th stack is greater than a distance from the interface between the n-type charge generation layer and the p-type charge generation layer to the light-emitting layer of the (n-1)-th stack, and the phosphorescent dopant of the phosphorescent light-emitting layer in the n-th stack has a peak light emission at a lower wavelength than the fluorescent dopant of the fluorescent light-emitting layer in the (n-1)-th stack.

8. The organic light-emitting display device according to claim 7, wherein
the first to third subpixels each have light-emitting layers that emit light having different colors for corresponding ones of the first to n-th stacks, and
the first to n-th light-emitting layers of the first to third subpixels may have different thicknesses.

9. The organic light-emitting display device according to claim 8, wherein the first to n-th stacks have a common layer that is commonly provided for the first to third subpixels, excluding the light-emitting layers.

10. The organic light-emitting display device according to claim 9, wherein the charge generation layers are commonly provided for the first to third subpixels without disconnection.

11. The organic light-emitting display device according to claim 7, wherein the phosphorescent light-emitting layer of the n-th stack is thicker than the fluorescent light-emitting layer of the (n-1)-th stack.

12. The organic light-emitting display device according to claim 7, wherein a full width at half maximum of an emission spectrum of the phosphorescent light-emitting layer of the n-th stack comprises a full width at half maximum of an emission spectrum of the fluorescent light-emitting layer of the (n-1)-th stack.

13. An organic light-emitting display device comprising:
a substrate;
a first electrode of a first subpixel and a first electrode of a second subpixel on the substrate;
a first light-emitting layer on the first electrode of the first subpixel, wherein the first light-emitting layer is a fluorescent light-emitting layer including a first fluorescent dopant and is configured to emit light of a first color;
a second light-emitting layer on the first electrode of the second subpixel disposed adjacent to the first light-emitting layer, wherein the second light-emitting layer is a fluorescent light-emitting layer including a second fluorescent dopant and is configured to emit light of a second color;
a charge generation layer on the first light-emitting layer and the second light-emitting layer, comprising an n-type charge generation layer and a p-type charge generation layer;
a third light-emitting layer on the charge generation layer overlapping the first light-emitting layer, wherein the third light-emitting layer is a phosphorescent light-emitting layer including a first phosphorescent dopant and is configured to emit light of the first color;

a fourth light-emitting layer on the charge generation layer disposed adjacent to the third light-emitting layer and overlapping the second light-emitting layer, wherein the fourth light-emitting layer is a phosphorescent light-emitting layer including a second phosphorescent dopant and is configured to emit light of the second color; and
a second electrode on the third light-emitting layer and the fourth light-emitting layer,
wherein a first distance from an interface between the n-type charge generation layer and the p-type charge generation layer to the third light-emitting layer is equal to or greater than a second distance from the interface between the n-type charge generation layer and the p-type charge generation layer to the first light-emitting layer, and
the first phosphorescent dopant of the third light-emitting layer has a peak light emission at a lower wavelength than the first fluorescent dopant of the first light-emitting layer.

14. The organic light-emitting display device of claim 13, further comprising:
a hole injection layer on the first electrode of the first subpixel and the first electrode of the second subpixel;
a hole transport layer on the hole injection layer, and overlapping the first electrode of the first subpixel and the first electrode of the second subpixel;
an electron transport layer on the first light-emitting layer and the second light-emitting layer; and
an electron injection layer on the electron transport layer and overlapping the third light-emitting layer and the fourth light-emitting layer.

15. The organic light-emitting display device of claim 13, wherein the first light-emitting layer has a different thickness than the second light-emitting layer, and the third light-emitting layer has a different thickness than the fourth light-emitting layer.

16. The organic light-emitting display device of claim 13, wherein:
a third distance from the interface to the second light-emitting layer is less than or equal to a fourth distance from the interface to the fourth light-emitting layer.

17. The organic light-emitting display device of claim 13, wherein the third light-emitting layer is thicker than the first light-emitting layer, and the fourth light-emitting layer is thicker than the second light-emitting layer.

18. The organic light-emitting device according to claim 1,
wherein n is a natural number equal to or greater than three, and
each light-emitting layer of the other stacks excluding the (n-1)-th and n-th stacks is a phosphorescent light-emitting layer comprising at least one phosphorescent host and a phosphorescent dopant.

19. The organic light-emitting display device of claim 13, wherein the second phosphorescent dopant of the fourth light-emitting layer has a peak light emission at a lower wavelength than the second fluorescent dopant of the second light-emitting layer.

* * * * *